United States Patent
Nishiwaki et al.

(10) Patent No.: US 8,982,650 B2
(45) Date of Patent: Mar. 17, 2015

(54) MEMORY INTERFACE CIRCUIT AND TIMING ADJUSTING METHOD

(75) Inventors: Hitoaki Nishiwaki, Kasugai (JP); Shinichiro Ikeda, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 237 days.

(21) Appl. No.: 13/612,771

(22) Filed: Sep. 12, 2012

(65) Prior Publication Data

US 2013/0070544 A1    Mar. 21, 2013

(30) Foreign Application Priority Data

Sep. 15, 2011    (JP) .................................. 2011-202124

(51) Int. Cl.
| | | |
|---|---|---|
| G11C 7/00 | (2006.01) | |
| G11C 7/10 | (2006.01) | |
| G11C 11/4076 | (2006.01) | |
| G11C 11/4096 | (2006.01) | |

(52) U.S. Cl.
CPC ................ G11C 7/00 (2013.01); G11C 7/1066 (2013.01); G11C 7/1072 (2013.01); G11C 11/4076 (2013.01); G11C 11/4096 (2013.01)
USPC .... 365/193; 365/189.05; 365/194; 365/233.1

(58) Field of Classification Search
USPC .......................... 365/193, 194, 233.1, 189.05
See application file for complete search history.

(56) References Cited

U.S. PATENT DOCUMENTS

| | | | | |
|---|---|---|---|---|
| 7,733,716 B2 * | 6/2010 | Mizutani | ........................ | 365/193 |
| 7,902,887 B2 * | 3/2011 | Bae et al. | ....................... | 327/156 |
| 7,907,471 B2 * | 3/2011 | Murakami | ................. | 365/233.1 |
| 8,711,643 B2 * | 4/2014 | Kato | ............................. | 365/193 |
| 2005/0213396 A1 | 9/2005 | Aoki | | |
| 2008/0043782 A1 | 2/2008 | Skerlj et al. | | |
| 2009/0006881 A1 | 1/2009 | Ogura | | |

FOREIGN PATENT DOCUMENTS

| | | |
|---|---|---|
| JP | 2005-276396 | 10/2005 |
| JP | 2007-265399 | 10/2007 |
| JP | 2008-047118 | 2/2008 |
| JP | 2008-293279 | 12/2008 |
| JP | 2010-250859 | 11/2010 |

OTHER PUBLICATIONS

JPOA—Japanese Office Action for Application No. 2011-202124, mailed on Jan. 6, 2015, with partial English translation.

* cited by examiner

*Primary Examiner* — Pho M Luu
(74) *Attorney, Agent, or Firm* — Fujitsu Patent Center

(57) ABSTRACT

A memory interface circuit, which controls capture timing of data provided from a memory according to a strobe signal provided from the memory, includes a control unit that controls an activation timing of an internal strobe gate signal, which masks the strobe signal when being deactivated, by delaying the internal strobe gate signal by a first period shorter than one cycle time of a clock signal to generate an internal strobe gate adjustment signal, and by adjusting an activation timing of the adjustment signal. A detection unit outputs a detection signal, when the strobe signal changes from a first potential to a second potential higher than the first potential, or when the first potential of the strobe signal continues for a second period or longer. The control unit adjusts the activation timing of the adjustment signal in accordance with the detection signal.

10 Claims, 14 Drawing Sheets

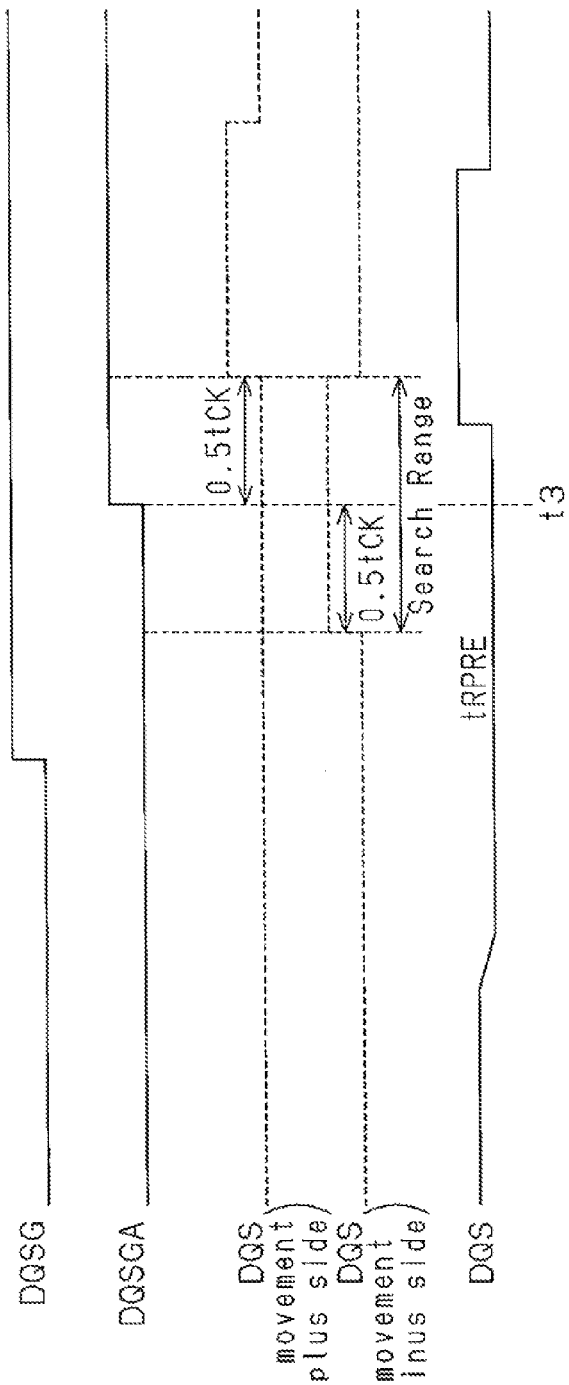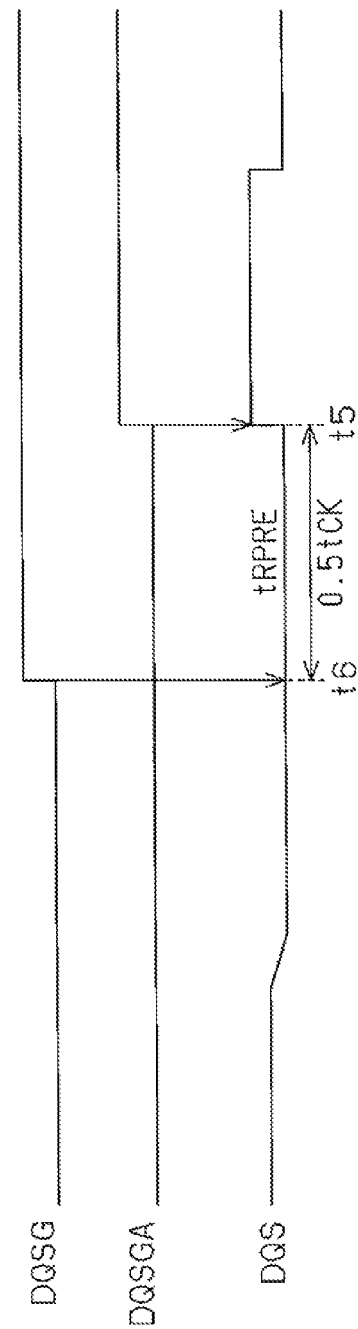

MEMORY INTERFACE CIRCUIT AND TIMING ADJUSTING METHOD

CROSS-REFERENCE TO RELATED APPLICATIONS

This application is based upon and claims the benefit of priority from prior Japanese Patent Application No. 2011-202124, filed on Sep. 15, 2011, the entire contents of which are incorporated herein by reference.

FIELD

This disclosure relates to a memory interface circuit and a timing adjusting method.

BACKGROUND

A DRAM (Dynamic Random Access Memory) as a semiconductor memory has been conventionally used. In recent years, to address higher operating speed of a system, a double data rate method of inputting/outputting data at each of rising and falling of a clock has been adopted. Such semiconductor memory is called as a DDR-SDRAM (Double Data Rate Synchronous Dynamic Random Access Memory), a DDR2-SDRAM, or a DDR3-SDRAM.

For example, when a system device reads data from the DDR-SDRAM, the DDR-SDRAM outputs read data and a read data strobe signal in synchronization with the read data. A receiving circuit provided in the system device adjusts timing of the strobe signal, and captures the read data based on the adjusted strobe signal.

Generally, a signal line for transmitting the strobe signal to the system device is used as a transmission line for bidirectional communication, and is coupled to a plurality of memories. In this case, each of the memories drives the signal line and transmits the strobe signal in a period in which the read data is output, and does not drive the signal line in the other period. Accordingly, as illustrated in FIG. 16A, a logic of a strobe signal DQS is established in a period effective in capturing the read data, a preamble period prior to a leading rising edge effective in capturing the read data, and a postamble period existing after a last falling edge effective in capturing the read data. However, the strobe signal DQS is put into a high impedance (Hi-Z) state in the other period. When the strobe signal DQS is directly provided to a clock terminal of a latch circuit arranged in the receiving circuit to capture the read data, the read data latched once may be damaged if a pulse is superimposed on the strobe signal DQS in the Hi-Z state.

Japanese Laid-Open Patent Publications No. 2010-250859 and No. 2008-293279 each describe using an internal strobe gate signal to mask the strobe signal DQS in the Hi-Z state, so that the strobe signal DQS in the Hi-Z state is not provided to the latch circuit. According to this method, the internal strobe gate signal is generated so as to shift to an H-potential allowing capture of the strobe signal DQS during the preamble period tRPRE of the strobe signal DQS, and shift to an L-potential inhibiting capture of the strobe signal DQS during the postamble period of the strobe signal DQS.

However, various variation factors, such as input/output characteristics of the system device, transmission line delay, and memory characteristics, exist in a path in which a clock signal CK is transmitted from the system device to the memories and the strobe signal DQS is transmitted from the memories to the receiving circuit. Therefore, a signal delay (flight time) in the path is not uniform. Accordingly, the timing when the strobe signal DQS is transmitted to the receiving circuit is not also uniform. For example, as illustrated in FIG. 16A, a rising edge of the strobe signal DQS may be deviated from a rising edge of the clock signal CK after a lapse of a read latency RL from a read command READ (hereinafter, also referred to as "reference edge RE"). This deviation is defined as tDQSCK. In FIG. 16A, a minimum value of the deviation (phase error) from the reference edge RE is represented as tDQSCKmin, and a maximum value of the deviation (phase error) from the reference edge RE is represented as tDQSCKmax. In the case of tDQSCK of "0", the rising edge and falling edge of the clock signal CK correspond to the rising edge and falling edge of the strobe signal DQS, respectively. Here, in a memory including a delay locked loop (DLL) circuit such as DDR3-SDRAM, the DLL circuit matches the phase of the strobe signal DQS with the phase of the clock signal CK with high accuracy. Thus, the above-mentioned deviation is small. For example, in the tDQSCK specifications of the DDR3-SDRAM, tDQSCKmin is −500 ps, and tDQSCKmax is +500 ps.

As described above, the timing when the strobe signal DQS is transmitted to the receiving circuit is not uniform. Thus, the timing of the internal strobe gate signal is adjusted in accordance with the flight time so that the rising edge of the internal strobe gate signal (activation timing) comes in the preamble period of the strobe signal DQS. Here, when the deviation is small, as illustrated in FIG. 16B, the leading rising edge following the preamble period tRPRE of the strobe signal DQS may be detected by searching the vicinity of the reference edge RE. Thus, by adjusting the timing such that the internal strobe gate signal DQSG rises at a timing at which the phase is shifted from the phase of the detected leading rising edge by, for example, −180 degrees, the internal strobe gate signal DQSG may be risen in the preamble period tRPRE of the strobe signal DQS.

In recent years, an LPDDR2-SDRAM (Low Power DDR2 SDRAM) that dramatically improves power consumption and data transfer rate of mobile equipment has been developed. However, since the LPDDR2-SDRAM has no DLL circuit that adjusts the phase between the clock signal on the side of the system device and the strobe signal DQS, the output timing of the strobe signal DQS largely varies. In this case, for example, as illustrated in FIG. 17, the memory having no DLL circuit controls the strobe signal DQS based on the reference edge RE of the clock signal CK that rises after a lapse of the read latency RL from the read command READ. In such a memory, tDQSCK is defined as a delay time (phase delay) from the reference edge RE to the leading rising edge of the strobe signal DQS. In FIG. 17, a minimum value of the delay time from the reference edge RE is represented as tDQSCKmin, and a maximum value of the delay time from the reference edge RE is represented as tDQSCKmax. In the tDQSCK specifications of the LPDDR2-SDRAM, tDQSCKmin is +2500 ps, and tDQSCKmax is +5500 ps, which are larger than those of the DDR3-SDRAM by an order of magnitude or larger.

To adjust the timing of the internal strobe gate signal in the LPDDR2-SDRAM, it is required to extend a search range for searching the leading rising edge of the strobe signal DQS. However, as apparent from FIG. 17, a Hi-Z period of the strobe signal DQS (refer to a frame indicated by a broken line) exists in a range from tDQSCKmin to tDQSCKmax. Therefore, when the search range is extended, the strobe signal DQS in the Hi-Z state is captured. Accordingly, there may be a case where the activation timing of the internal strobe gate signal may not be correctly adjusted.

Further, in the LPDDR2-SDRAM, the output timing of the strobe signal DQS varies by ±0.5 cycle time in the cycle time of the clock signal CK even during operation of the system device. Thus, also during the operation of the system device, the timing of the internal strobe gate signal needs to be intermittently adjusted.

SUMMARY

According to one aspect, a memory interface circuit that controls capture timing of data provided from a memory in accordance with a strobe signal provided from the memory is provided. A control unit controls an activation timing of an internal strobe gate signal, which masks the strobe signal when the internal strobe gate signal is being deactivated, by relatively delaying the internal strobe gate signal by a first period that is shorter than one cycle time of a clock signal to generate an internal strobe gate adjustment signal, and by adjusting an activation timing of the internal strobe gate adjustment signal. A detection unit outputs a detection signal, when the strobe signal changes from a first potential to a second potential that is higher than the first potential, or when the first potential of the strobe signal continues for a second period or longer. The control unit adjusts the activation timing of the internal strobe gate adjustment signal in accordance with the detection signal.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory and are not restrictive of the invention, as claimed.

BRIEF DESCRIPTION OF THE DRAWINGS

The embodiment, together with objects and advantages thereof, may best be understood by reference to the following description of the presently preferred embodiments together with the accompanying drawings in which:

FIGS. 3A and 3B are timing charts illustrating the operation of the gate training during operation;

DESCRIPTION OF THE EMBODIMENTS

One embodiment will now be described below with reference to FIGS. 1 to 15.

Figure 1:
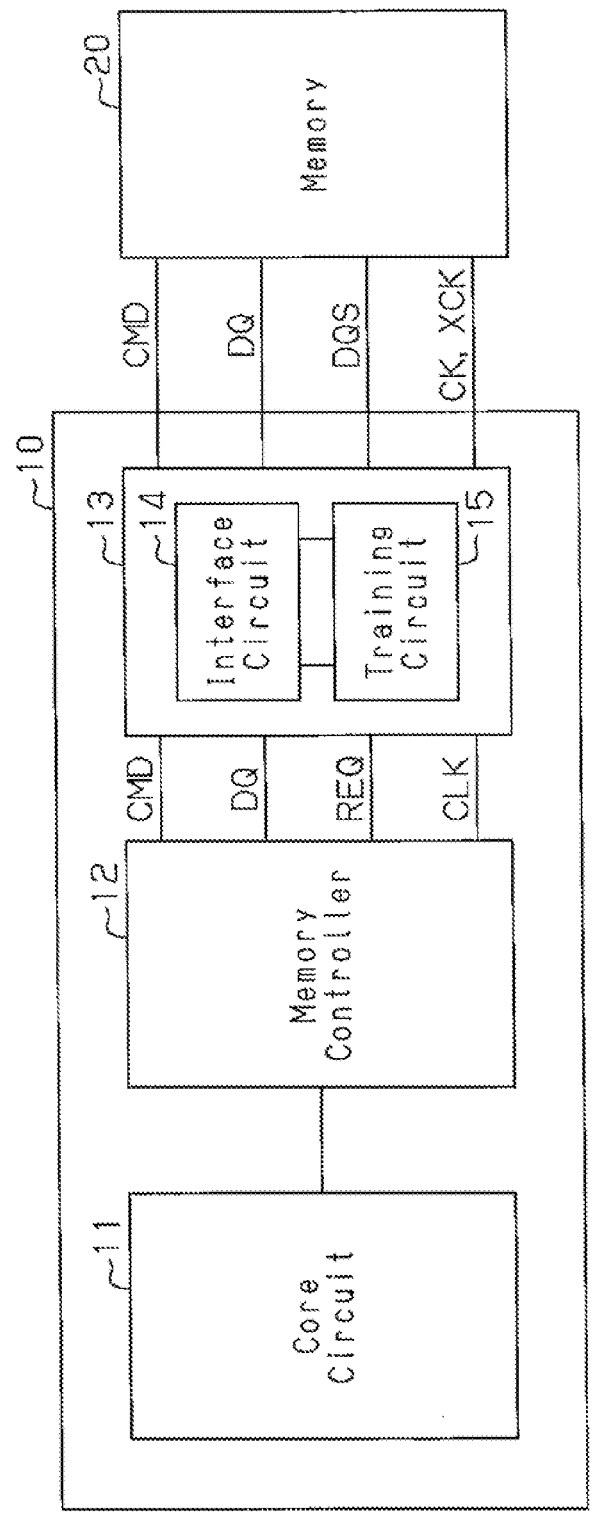
FIG. 1 is a schematic block diagram of a system.

As illustrated in FIG. 1, a system includes a controller 10 and a memory 20 accessed by the controller 10. The controller 10 is, for example, a semiconductor integrated circuit (e.g., LSI) that consists of one chip. The memory 20 is a synchronous semiconductor memory such as an LPDDR2-SDRAM (Low Power Double Data Rate 2 Synchronous Dynamic Random Access Memory).

An example of an internal structure of the controller 10 will now be described.

A core circuit 11 outputs a read request to read data in the memory 20 and an address at which the data is stored to a memory controller 12 in accordance with processing to be performed. The core circuit 11 outputs a write request to write data into the memory 20 and an address at which the data is stored to the memory controller 12. The core circuit 11 is, for example, a central processing unit (CPU).

The memory controller 12 provides the memory 20 via a memory interface circuit 13 with an internal clock signal CLK of the memory controller 12 as complementary clock signals CK and XCK.

In accordance with a request from the core circuit 11, the memory controller 12 accesses the memory 20 via the memory interface circuit 13. For example, when receiving the read request from the core circuit 11, the memory controller 12 provides a command CMD (here, read command) and the address to the memory 20 via the memory interface circuit 13. Then, the memory 20 responds to the read command, and provides a data sequence DQ read from the address and a data strobe signal DQS in synchronization with the potential shift timing of the data sequence DQ to the memory controller 12 via the memory interface circuit 13. Here, the memory 20 burst-outputs the data sequence DQ in synchronization with the potential shift timing of the complementary clock signals CK and XCK. That is, the memory 20 burst-outputs the data sequence DQ with a frequency twice as high as the internal clock signal CLK of the memory controller 12. The burst output means that data stored at consecutive addresses from a given leading address is sequentially output. When receiving the write request from the core circuit 11, the memory controller 12 provides a write command, the data sequence DQ, the strobe signal DQS, and the address (address at which the data sequence DQ is to be written) to the memory 20 via the memory interface circuit 13. Then, the memory 20 stores the data sequence DQ at the corresponding address.

The memory controller 12 also provides the memory interface circuit 13 with a request signal REQ to request execution of a gate training for correcting or adjusting timing when the data sequence DQ is captured by the memory interface circuit 13. The memory controller 12 outputs the request signal REQ at a given timing. This timing is, for example, at activation of the controller 10, or timing when the core circuit 11 does not access the memory 20 during the operation of the controller 10.

The memory interface circuit 13 includes an interface circuit 14 and a training circuit 15.

The interface circuit 14 transmits to the data sequence DQ to the memory 20 and receives the data sequence DQ from the memory 20 in accordance with the strobe signal DQS. In a read operation, the interface circuit 14 generates an internal strobe signal, the timing of which is adjusted according to the strobe signal DQS provided from the memory 20, captures the data sequence DQ in synchronization with the internal strobe signal, and provides the data sequence DQ to the memory controller 12. In a write operation, the interface circuit 14 provides the memory 20 with the data sequence DQ and the strobe signal DQS that are received from the memory controller 12.

In response to the request signal REQ from the memory controller 12, the training circuit 15 performs the gate training. The transmission line that transmits the strobe signal DQS is used as the transmission line for bidirectional communication. During a period other than a period of the read operation, the interface circuit 14 masks the strobe signal DQS with the internal strobe gate signal DQSG (refer to, for example, FIG. 2A). For example, when the internal strobe gate signal DQSG is in the L-potential (deactivated), the strobe signal DQS is masked, and when the internal strobe gate signal DQSG is in the H-potential (activated), the strobe signal DQS is captured by the interface circuit 14. The training circuit 15 adjusts activation timing of the internal strobe gate signal DQSG in accordance with shift timing from a first potential (low potential) of the strobe signal DQS, which is input from the memory 20, to a second potential (high potential) that is higher than the first potential. For example, the training circuit 15 adjusts the timing of the internal strobe gate signal DQSG so that the activation timing (rising edge) of the internal strobe gate signal DQSG comes in the preamble period tRPRE of the strobe signal DQS. The adjustment of the internal strobe gate signal DQSG prevents the strobe signal DQS in the high impedance state (Hi-Z state) from being captured by the interface circuit 14.

The preamble period tRPRE is a period in which the strobe signal DQS is set to the low potential (L-potential) by about one cycle time (for example, 0.9 cycle time) of the clock signal CK prior to leading rising of the strobe signal DQS effective in capturing the data sequence DQ. Accordingly, given that the cycle time of the clock signal CK is tCK, a length of the preamble period tRPRE may be expressed as 0.9 tCK. In the Hi-Z state, the strobe signal DQS is set to, for example, an intermediate voltage between the high potential (H-potential) and the L-potential by a terminal resistor (not illustrated) coupled to the outside of the interface circuit 14.

The gate training which is performed by the above-mentioned training circuit 15 will now be described.

The gate training is performed, for example, at activation of the controller 10. The gate training is also performed at fixed intervals during the system operation. First, the operation of the gate training performed at activation of the controller 10 will be described with reference to FIGS. 2A to 2C. For simplification of description, in FIGS. 2A to 2C, a vertical axis and a horizontal axis are appropriately extended or contracted.

Figure 2A:
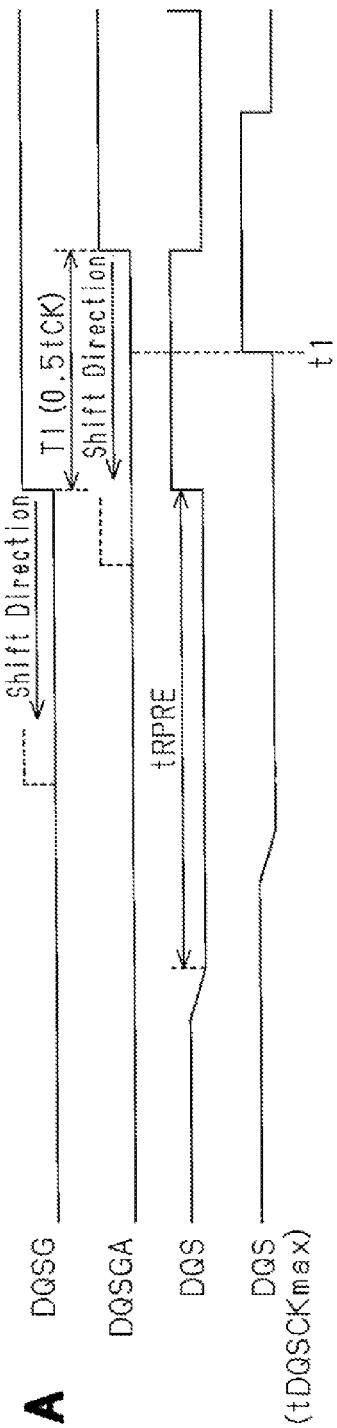
FIGS. 2A to 2C are timing charts illustrating the operation of a gate training at activation.
Figure 2B:
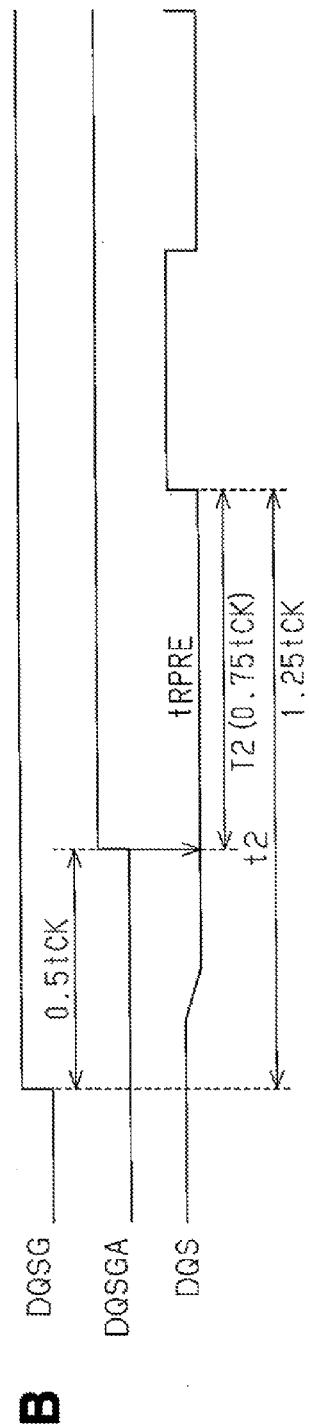
Figure 2C:
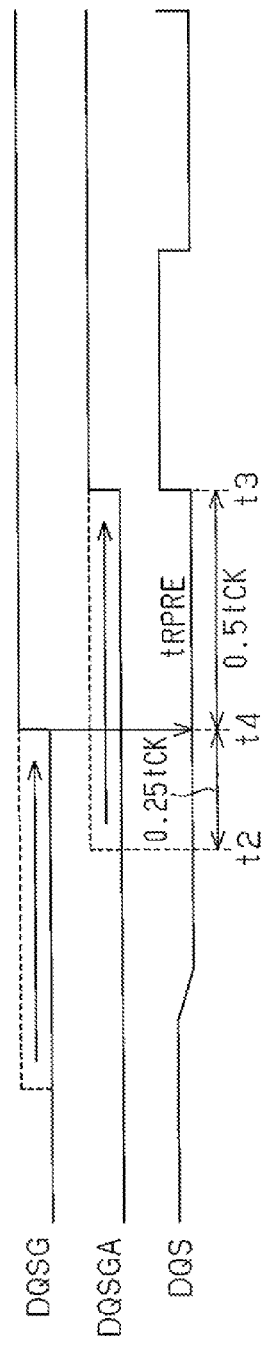
Figure 17:
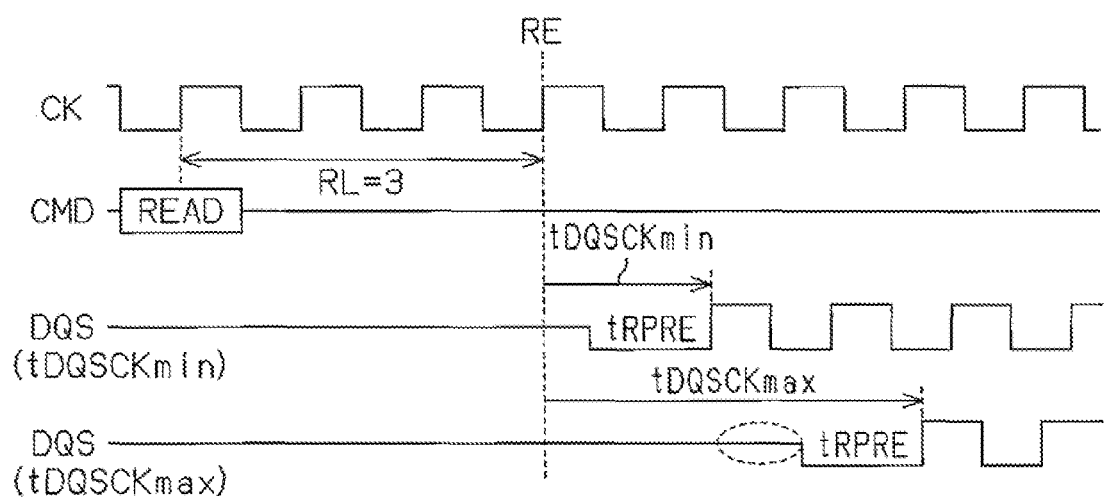
FIG. 17 is a timing chart illustrating relationship between a clock signal and a strobe signal in the related art.

As illustrated in FIG. 2A, the internal strobe gate signal DQSG is relatively delayed by a first period T1 (here, 0.5 tCK) to generate an internal strobe gate adjustment signal DQSGA. The activation timing of the internal strobe gate adjustment signal DQSGA is set to be later than timing (first timing t1 in FIG. 2A) of the leading rising edge of the strobe signal DQS delayed from the reference edge RE (refer to FIG. 17) of the clock signal CK by the maximum delay time tDQSCKmax. Subsequently, the activation timing of the internal strobe gate adjustment signal DQSGA is temporally shifted (i.e., time-shifted) forward. Then, in synchronization with the activation timing of the internal strobe gate adjustment signal DQSGA, which is temporally shifted forward, the potential of the strobe signal DQS is sequentially captured. At this time, as illustrated in FIG. 2B, when the low potential (L-potential) of the strobe signal DQS continues in a second period T2 (here, 0.75 tCK) from the activation timing (second timing t2) of the internal strobe gate adjustment signal DQSGA, it is determined that the preamble period tRPRE of the strobe signal DQS is detected. Next, as illustrated in FIG. 2C, the internal strobe gate adjustment signal DQSGA is temporally shifted to timing position (third timing t3) delayed by the second period T2 (here, 0.75 tCK) from the timing position at which the preamble period tRPRE is detected (second timing t2). Then, the time-shifted position (third timing t3) is set to a reference position of the internal strobe gate adjustment signal DQSGA in the gate training during the operation of the controller 10. At this time, together with the internal strobe gate adjustment signal DQSGA, the internal strobe gate signal DQSG is delayed by the second period T2 (0.75 tCK). Thereby, the activation timing of the internal strobe gate signal DQSG is set to a position (fourth timing t4) delayed by 0.25 tCK from the timing position at which the preamble period tRPRE is detected (second timing t2). That is, the activation timing of the internal strobe gate signal DQSG is set to the position near the center of the preamble period tRPRE.

Next, summary of the gate training during the operation of the controller 10 will now be described with reference to FIGS. 3A and 3B. For simplification of description, in FIGS. 3A and 3B, a vertical axis and a horizontal axis are appropriately extended or contracted.

As illustrated in FIG. 3A, the activation timing of the internal strobe gate adjustment signal DQSGA is time-shifted in a search range (here, range ±0.5 tCK) corresponding to the tDQSCK specifications of the memory 20 based on the reference position (third timing t3) set at the above-mentioned gate training performed at activation of the controller 10. Then, the potential of the strobe signal DQS is sequentially captured in synchronization with the time-shifted activation timing of the internal strobe gate adjustment signal DQSGA. Then, as illustrated in FIG. 3B, timing at which the strobe signal DQS shifts from the L-potential to the H-potential (or timing when the strobe signal DQS shifts from the H-potential to the L-potential) is detected, and the activation timing of the internal strobe gate adjustment signal DQSGA is matched with the detected timing position (fifth timing t5). Thereby, the rising edge (activation timing) of the internal strobe gate adjustment signal DQSGA is matched with the leading rising edge of the strobe signal DQS. At this time, together with the internal strobe gate adjustment signal DQSGA, the internal strobe gate signal DQSG is also shifted. Thus, the activation timing of the internal strobe gate signal DQSG is set to a position near the center of the preamble period tRPRE of the strobe signal DQS (sixth timing t6).

Next, an example of the structure of the memory interface circuit 13, which is related to the gate training, will be described with reference to FIGS. 4 to 7. First, an example of the structure of the interface circuit 14 will be described.

The interface circuit 14 includes a command transmission circuit 31, a receiving circuit 32, and a delay control circuit 33. When the data sequence DQ is read from the memory 20, the command transmission circuit 31 receives the read command READ provided from the memory controller 12 via the training circuit 15. When the gate training is performed, the command transmission circuit 31 receives a training LPDDR2 command (mode resistor read command MRR) from the training circuit 15. The command transmission circuit 31 transmits the read command READ or the mode resistor read command MRR to the memory 20. The memory 20 reads a mode signal set to a mode resistor (not illustrated) in response to the mode resistor read command MRR, and selects a training operating mode according to the mode signal.

The receiving circuit 32 receives the data sequence DQ output from the memory 20 based on the strobe signal DQS. An example of an internal structure of the receiving circuit 32 will now be described with reference to FIG. 5.

The receiving circuit 32 includes a first DLL circuit 34, an AND circuit 35, a second DLL circuit 36, and D-type flip-flop circuits (FF circuits) 37 and 38.

A pulse signal PS that rises at a given timing is provided to the first DLL circuit 34. In response to the rising edge of the clock signal CK (reference edge RE) after a read latency RL from the command CMD (for example, the read command READ), the pulse signal PS rises to the H-potential. As illustrated in FIG. 5, a first delay amount D1 or a second delay amount D2 is provided from the delay control circuit 33 (refer to FIG. 4) to the first DLL circuit 34.

In the read operation, the first DLL circuit 34 adds the first delay amount D1 to the pulse signal PS to generate the internal strobe gate signal DQSG. That is, the first delay amount D1 is used to adjust the activation timing of the internal strobe gate signal DQSG. The first delay amount D1 delays the internal strobe gate signal DQSG so that the activation timing of the internal strobe gate signal DQSG (rising edge) comes near the center of the preamble period tRPRE of the strobe signal DQS. In the gate training, the first DLL circuit 34 also adds the second delay amount D2 to the pulse signal PS to generate the internal strobe gate adjustment signal DQSGA. That is, the second delay amount D2 is used to adjust the activation timing of the internal strobe gate adjustment signal DQSGA. In the gate training, the second delay amount D2 sequentially shifts the activation timing (rising edge) of the internal strobe gate adjustment signal DQSGA. Here, the second delay amount D2 is obtained by adding 0.5 tCK to the first delay amount D1. Then, the internal strobe gate signal DQSG or the internal strobe gate adjustment signal DQSGA, which is generated by the first DLL circuit 34, is provided to the AND circuit 35.

The first DLL circuit 34 has a time resolution of 1/64 tCK, for example. Therefore, the timing (delay set value) of the internal strobe gate signal DQSG and the internal strobe gate adjustment signal DQSGA may be adjusted in the unit of 1/64 tCK.

The strobe signal DQS is provided to the AND circuit 35. The AND circuit 35 calculates a logical AND of the strobe signal DQS and the internal strobe gate signal DQSG or a logical AND of the strobe signal DQS and the internal strobe gate adjustment signal DQSGA to output an internal strobe signal IDQS according to the calculation result. For example, when the internal strobe gate signal DQSG is in the L-potential, the AND circuit 35 generates the internal strobe signal IDQS of L-potential regardless of the level of the strobe signal DQS. Thus, when the internal strobe gate signal DQSG is in the L-potential, the strobe signal DQS is masked. When the internal strobe gate signal DQSG is in the H-potential, the AND circuit 35 generates the internal strobe signal IDQS that rises/falls at substantially the same timing as the strobe signal DQS. Similarly, in response to the internal strobe gate adjustment signal DQSGA of L-potential, the AND circuit 35 generates the internal strobe signal IDQS of L-potential. In response to the internal strobe gate adjustment signal DQSGA of H-potential, the AND circuit 35 generates the internal strobe signal IDQS that rises/falls at the substantially same timing as the strobe signal DQS. This internal strobe signal IDQS is provided to the second DLL circuit 36, and also to the training circuit 15 via the delay control circuit 33 (refer to FIG. 4).

The second DLL circuit 36 adds a given delay amount (for example, by 90 degrees of the phase of the internal strobe signal IDQS) to the internal strobe signal IDQS to generate a delayed internal strobe signal (delayed signal) IDQSd. The delayed signal IDQSd is provided to the clock terminals of the FF circuits 37 and 38.

The data sequence DQ is provided from the memory 20 to data input terminals of the FF circuits 37 and 38. The FF circuits 37 and 38 continuously receive the data sequence DQ having the amount of data corresponding to a burst length in synchronization with the strobe signal DQS. Here, the burst length means the number of continuous operations in the burst operation of the memory, and the address is continuously updated from the designated leading address by the number of times defined by the burst length. The FF circuit 37 latches the data sequence DQ in response to the rising edge of the delayed internal strobe signal IDQSd, and outputs read data RD1 having the same level as the latched level. The FF circuit 38 latches the data sequence DQ in response to the falling edge of the delayed internal strobe signal IDQSd, and outputs read data RD2 having the same level as the latched level. The read data RD1 and RD2 is provided to a second transmitting/receiving circuit 43 provided in the training circuit 15, or the memory controller 12 (refer to FIG. 4).

In this manner, the FF circuits 37 and 38 capture the data sequence DQ at double data rate in synchronization with the rising edge and the falling edge of the internal strobe signal IDQS.

Figure 4:
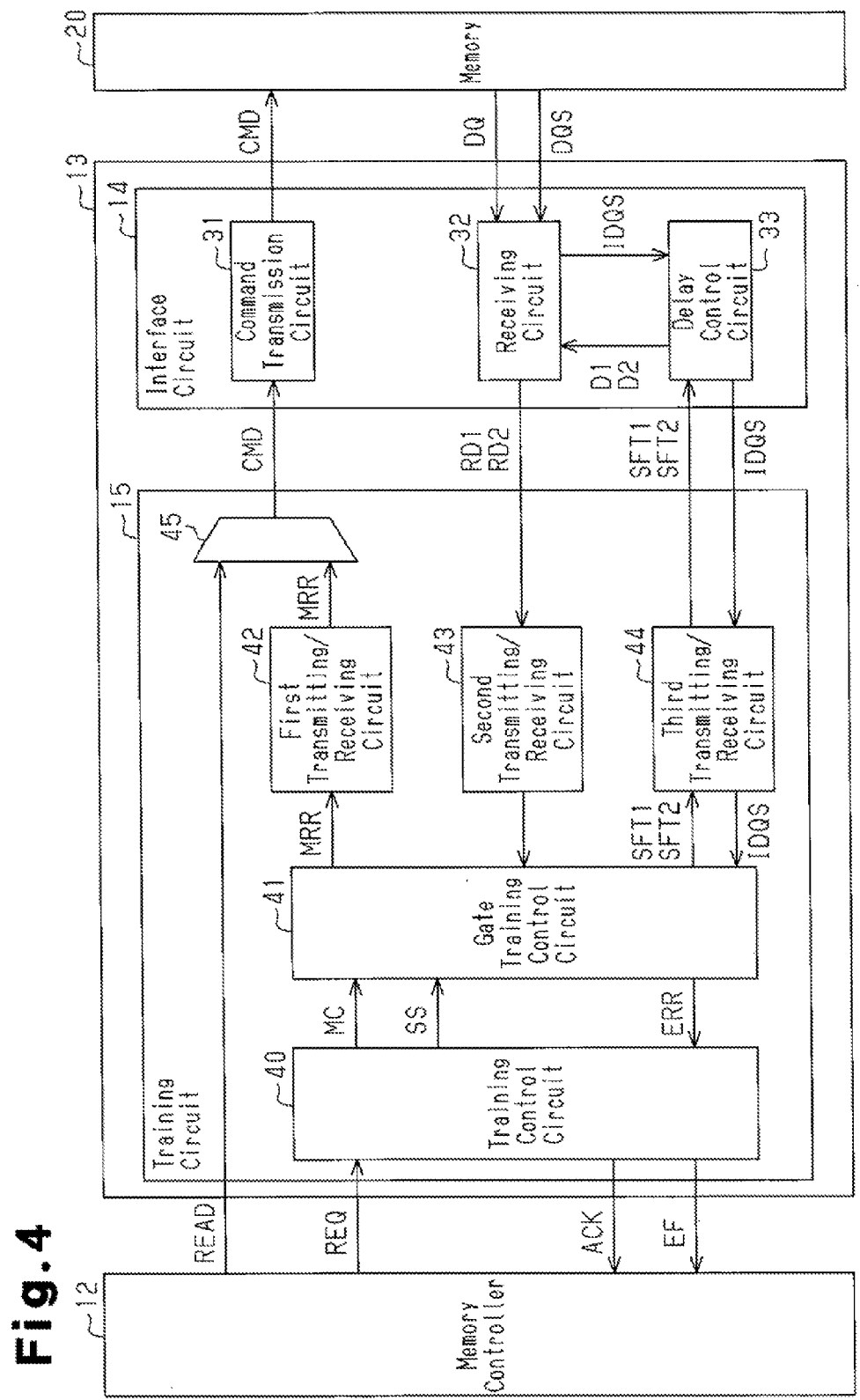
FIG. 4 is a block diagram illustrating an example of an internal structure of a memory interface circuit.
Figure 5:
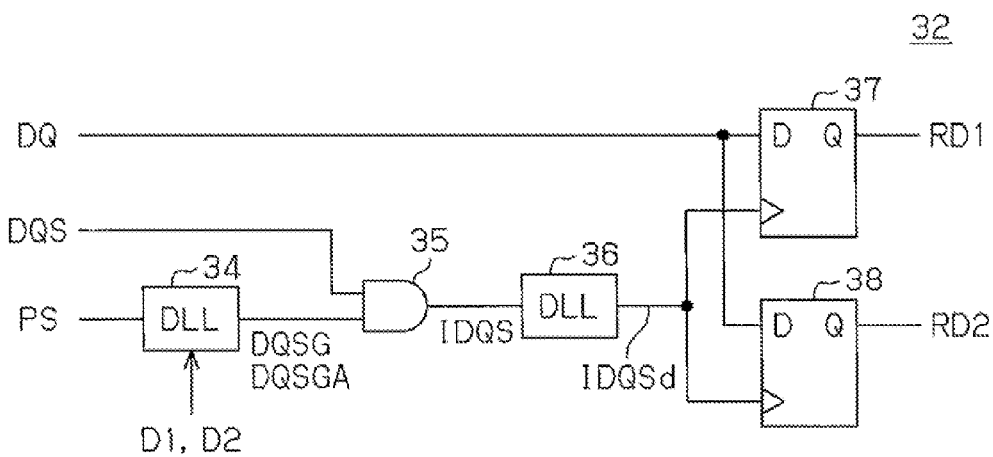
FIG. 5 is a block diagram illustrating an example of an internal structure of a receiving circuit.
Figure 6:
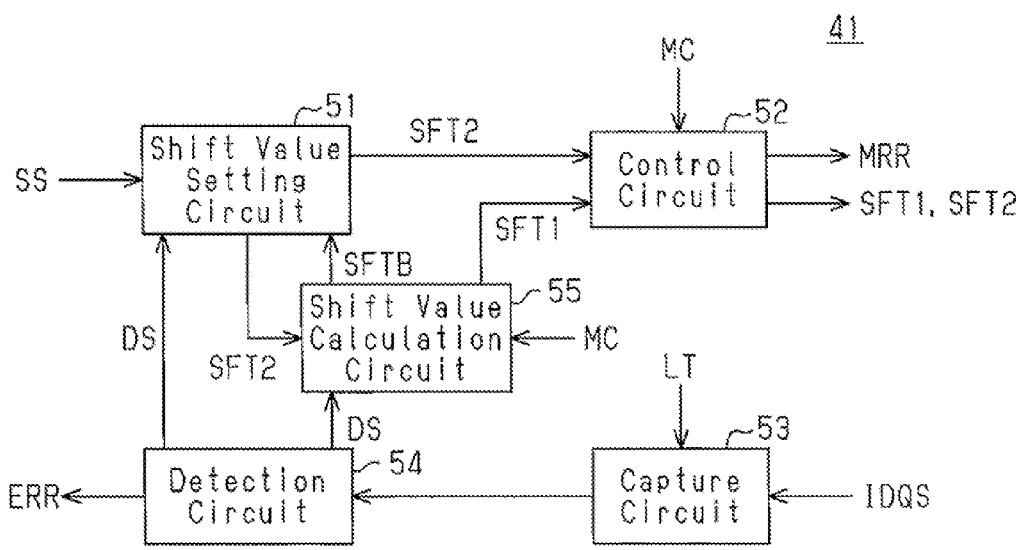
FIG. 6 is a block diagram illustrating an example of an internal structure of a gate training control circuit.

As illustrated in FIG. 4, a first shift value SFT1 or a second shift value SFT2 is provided from the training circuit 15 to the delay control circuit 33. The delay control circuit 33 decodes the first shift value SFT1 to generate the first delay amount D1, and provides the first delay amount D1 to the receiving circuit 32. The delay control circuit 33 decodes the second shift value SFT2 to generate the second delay amount D2, and provides the second delay amount D2 to the receiving circuit 32. The delay control circuit 33 also provides the internal strobe signal IDQS, which is output from the receiving circuit 32, to a third transmitting/receiving circuit 44 of the training circuit 15.

Next, an example of the structure of the training circuit 15 will now be described.

As illustrated in FIG. 4, the training circuit 15 includes a training control circuit 40, a gate training control circuit 41, a first transmitting/receiving circuit 42, the second transmitting/receiving circuit 43, the third transmitting/receiving circuit 44, and a selector 45.

The training control circuit 40 controls the whole of the training circuit 15 (training operation). The training control circuit 40 receives the request signal REQ from the memory controller 12, and controls the gate training control circuit 41 and the selector 45 according to the request signal REQ. In response to the request signal REQ, the training control circuit 40 returns an acknowledge signal ACK to the memory controller 12. For example, in response to the request signal REQ, the training control circuit 40 rises the acknowledge signal ACK to the H-potential. Then, when the gate training is normally finished, that is, the activation timing of the internal strobe gate signal DQSG is appropriately adjusted, the training control circuit 40 falls the acknowledge signal ACK to the L-potential. The training control circuit 40 also provides the gate training control circuit 41 with a mode switching signal MC of switching between the training operation and the normal operation (for example, the read operation). When the training operation is instructed, the mode switching signal MC designates the gate training at activation of the controller 10 or the gate training during the operation of the controller 10.

The training control circuit 40 generates the setting signal SS indicating the search range which temporally shifts (i.e., time-shifts) the internal strobe gate adjustment signal DQSGA to capture the potential of the internal strobe signal IDQS. The training control circuit 40 generates the setting signal SS according to the tDQSCK specifications of the memory 20. The setting signal SS is provided to the gate training control circuit 41. For example, the setting signal SS is generated as a signal indicating a start position and an end position of the search range. In the case where the rising edge of the strobe signal DQS is not detected in the search range, an error signal ERR is provided from the gate training control circuit 41 to the training control circuit 40. In this case, in response to the error signal ERR, the training control circuit 40 provides the memory controller 12 with an error flag EF to request retrial (retry) of the training operation.

The gate training control circuit 41 controls the gate training operation. An example of an internal structure of the gate training control circuit 41 will now be described with reference to FIG. 6.

The gate training control circuit 41 includes a shift value setting circuit 51, a control circuit 52, a capture circuit 53, a detection circuit 54, and a shift value calculation circuit 55.

A setting signal SS is provided to the shift value setting circuit 51. The shift value setting circuit 51 generates the second shift value SFT2 based on the setting signal SS. Based on the second shift value SFT2, the activation timing of the internal strobe gate adjustment signal DQSGA is time-shifted in the search range set by the setting signal SS. A reference shift value SFTB is also provided to the shift value setting circuit 51 from the shift value calculation circuit 55. The reference shift value SFTB is the second shift value SFT2 set such that the rising edge of the internal strobe gate adjustment signal DQSGA matches the leading rising edge of the strobe signal DQS in the previous gate training operation. Based on the setting signal SS and the reference shift value SFTB, the shift value setting circuit 51 generates the second shift value SFT2 for time-shifting the activation timing of the internal strobe gate adjustment signal DQSGA in the search range set by the setting signal SS. The shift value setting circuit 51 decreases the second shift value SFT2 in the search range in a stepwise manner, that is, decreases the second shift value SFT2 by every small period. This small period is set in accordance with, for example, a time resolution (resolution of delay adjustment) of the first DLL circuit 34 (refer to FIG. 5). In this embodiment, the small period is set to 1/64 tCK.

The first shift value SFT1 for adjusting the activation timing of the internal strobe gate signal DQSG is provided from the shift value calculation circuit 55 to the control circuit 52. The mode switching signal MC is also provided to the control circuit 52 from the training control circuit 40 (refer to FIG. 4). The control circuit 52 generates a signal corresponding to the operating mode designated by the mode switching signal MC. In this embodiment, in the gate training operation, the control circuit 52 generates the mode resistor read command MRR in response to the mode switching signal MC. The mode resistor read command MRR is provided to the first transmitting/receiving circuit 42 (refer to FIG. 4). Further, in the gate training operation, the control circuit 52 provides the third transmitting/receiving circuit 44 with the second shift value SFT2 generated by the shift value setting circuit 51. In the read operation, the control circuit 52 provides the third transmitting/receiving circuit 44 with the first shift value SFT1 generated by the shift value calculation circuit 55.

Figure 7:
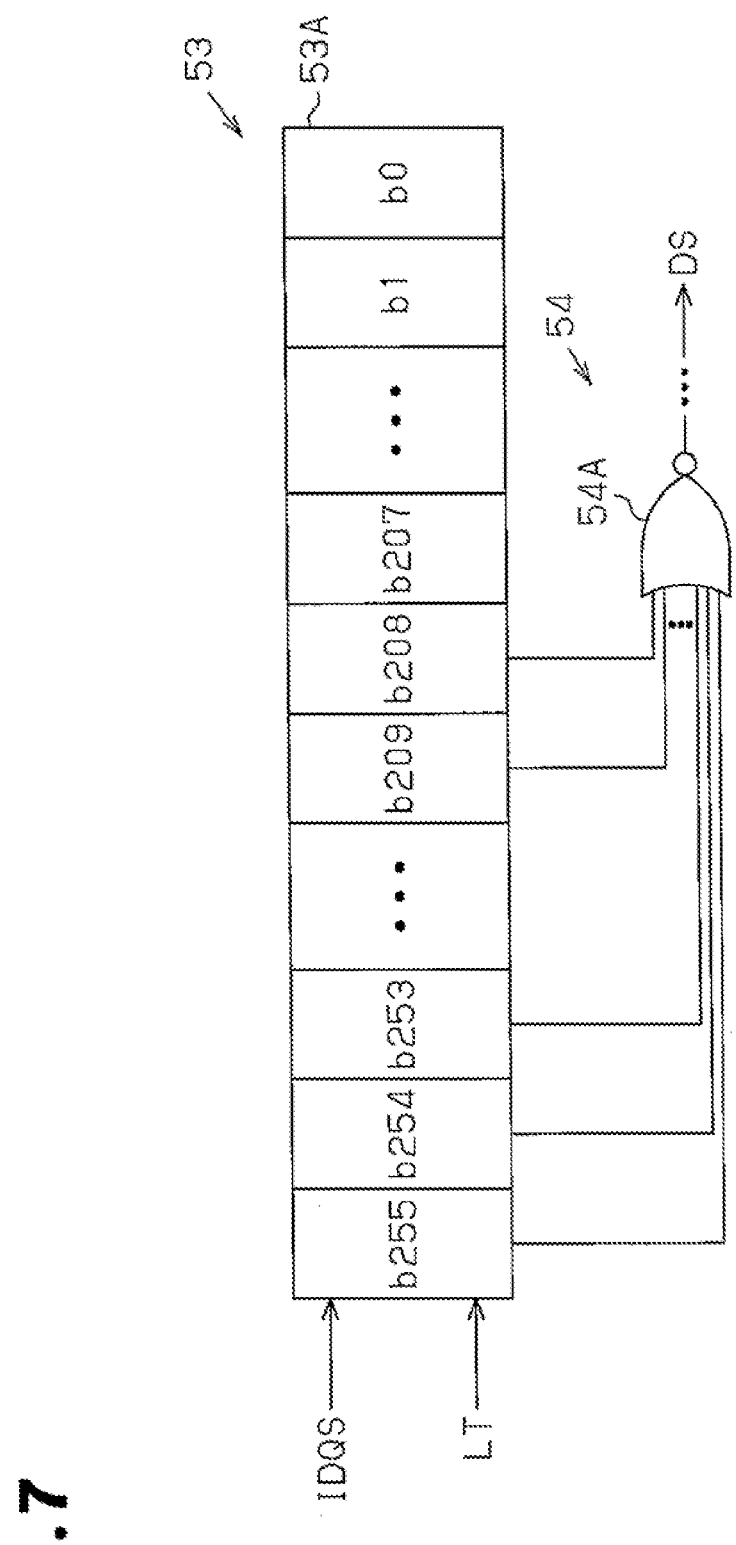
FIG. 7 is a circuit diagram illustrating an example of an internal structure of a capture circuit and a detection circuit.

The internal strobe signal IDQS is provided from the receiving circuit 32 (refer to FIG. 4) to the capture circuit 53 through the delay control circuit 33 and the third transmitting/receiving circuit 44. The capture circuit 53 detects the potential of the internal strobe signal IDQS each time the activation timing of the internal strobe gate adjustment signal DQSGA is time-shifted, and keeps the detected potential. As illustrated in FIG. 7, for example, the capture circuit 53 includes a shift register 53A. The shift register 53A includes a plurality of (here, 256) serially-coupled FF circuits (bits) b0 to b255. The shift register 53A operates in response to a latch signal LT of H-potential, which is output in synchronization with the activation timing of the internal strobe gate adjustment signal DQSGA. The shift register 53A shifts values of the bits b255 to b1 to the bits b254 to b0, respectively, each time the latch signal LT of H-potential is input, and then captures the value of the bit b255 as the internal strobe signal IDQS. As described above, the activation timing of the internal strobe gate adjustment signal DQSGA is time-shifted in the unit of 1/64 tCK. Thus, the values latched by the 48 upper bits b255 to b208 of the shift register 53A correspond to the potential of the internal strobe signal IDQS in a period of 0.75 (=48/64) tCK.

The detection circuit 54 detects a given detection point of the internal strobe signal IDQS captured by the capture circuit 53, and generates a detection signal DS indicating the detection result. For example, in the gate training at activation, the detection circuit 54 generates the detection signal DS indicating that the L-potential of the internal strobe signal IDQS continues for the second period T2 (for example, 0.75 tCK). As illustrated in FIG. 7, the detection circuit 54 includes an NOR circuit 54A having input terminals coupled to output terminals of the 48 upper bits b255 to b208 of the shift register 53A. Thus, when the L-potential of the internal strobe signal IDQS continues for 0.75 tCK, the NOR circuit 54A generates an output signal of H-potential. The detection circuit 54 keeps the detection signal DS to be in the H-potential during a given period from when the output signal of the NOR circuit 54A rises to the H-potential. In the gate training during the operation of the controller 10, the detection circuit 54 detects the rising edge of the internal strobe signal IDQS, and generates the detection signal DS indicating the detection result. In the gate training during the operation of the controller 10, first, all of the bits b0 to b255 of the shift register 53A are set to the initial value (=1). Thus, when values (potential state) latched to the two upper bits b255 and b254 are different from each other, the rising edge of the internal strobe signal IDQS is detected. Based on the detection of the rising edge of the internal strobe signal IDQS, the detection circuit 54 keeps the detection signal DS to be in the H-potential for a given period. The detection signal DS is provided to the shift value setting circuit 51 and the shift value calculation circuit 55. In response to detection signal DS of H-potential, the shift value setting circuit 51 provides the second shift value SFT2 to the shift value calculation circuit 55, and subtraction processing of the second shift value SFT2 is finished.

In the gate training during the operation of the controller 10, in the case where the rising edge of the internal strobe signal IDQS is not detected in the search range, the detection circuit 54 provides the error signal ERR to the training control circuit 40 (refer to FIG. 4).

The mode switching signal MC is provided from the training control circuit 40 to the shift value calculation circuit 55. The shift value calculation circuit 55 switches its operation in accordance with the mode switching signal MC.

When the mode switching signal MC instructs the gate training at activation, in response to the detection signal DS of H-potential, the shift value calculation circuit 55 adds the second period T2 (for example, 0.75 tCK) to the second shift value SFT2 from the shift value setting circuit 51 to generate the reference shift value SFTB.

When the mode switching signal MC instructs the gate training during the operation of the controller 10, in response to the detection signal DS of H-potential, the shift value calculation circuit 55 sets the second shift value SFT2 for matching the rising edge of the internal strobe gate adjustment signal DQSGA with the leading rising edge of the internal strobe signal IDQS as the reference shift value SFTB. Further, the shift value calculation circuit 55 subtracts the first period T1 (for example, 0.5 tCK) from the reference shift value SFTB to generate the first shift value SFT1. Then, the shift value calculation circuit 55 provides the reference shift value SFTB to the shift value setting circuit 51, and provides the first shift value SFT1 to the control circuit 52.

As illustrated in FIG. 4, the mode resistor read command MRR is provided to the first transmitting/receiving circuit 42. The first transmitting/receiving circuit 42 transmits the received mode resistor read command MRR to the selector 45. The selector 45 receives the read command READ from the memory controller 12. Based on a control signal from the training control circuit 40, the selector 45 transmits the read command READ or the mode resistor read command MRR to the command transmission circuit 31.

The second transmitting/receiving circuit 43 transmits the read data, which is provided from the receiving circuit 32, to the gate training control circuit 41. The third transmitting/receiving circuit 44 controls transmission/reception of the first shift value SFT1, the second shift value SFT2 and the internal strobe signal IDQS between the gate training control circuit 41 and the delay control circuit 33.

In this embodiment, the controller 10 is an example of a system device. The delay control circuit 33, the first DLL circuit 34, the shift value setting circuit 51, the control circuit 52, and the shift value calculation circuit 55 are an example of a control unit. The first DLL circuit 34 is an example of a delay circuit. The capture circuit 53 and the detection circuit 54 are an example of a detection unit. The second shift value SFT2 is an example of a delay set value, and the tDQSCK specifications are examples of output delay specifications. The gate training at activation of the controller 10 is an example of a first gate training, and the gate training during the operation of the controller 10 is an example of a second gate training.

Next, the operation of the memory interface circuit 13 (here, operation of the gate training) will now be described.

First, the operation of the gate training at activation will be described with reference to FIGS. 8 to 11. For simplification of description, in FIGS. 9 to 11, a vertical axis and a horizontal axis are appropriately extended or contracted.

Figure 8:
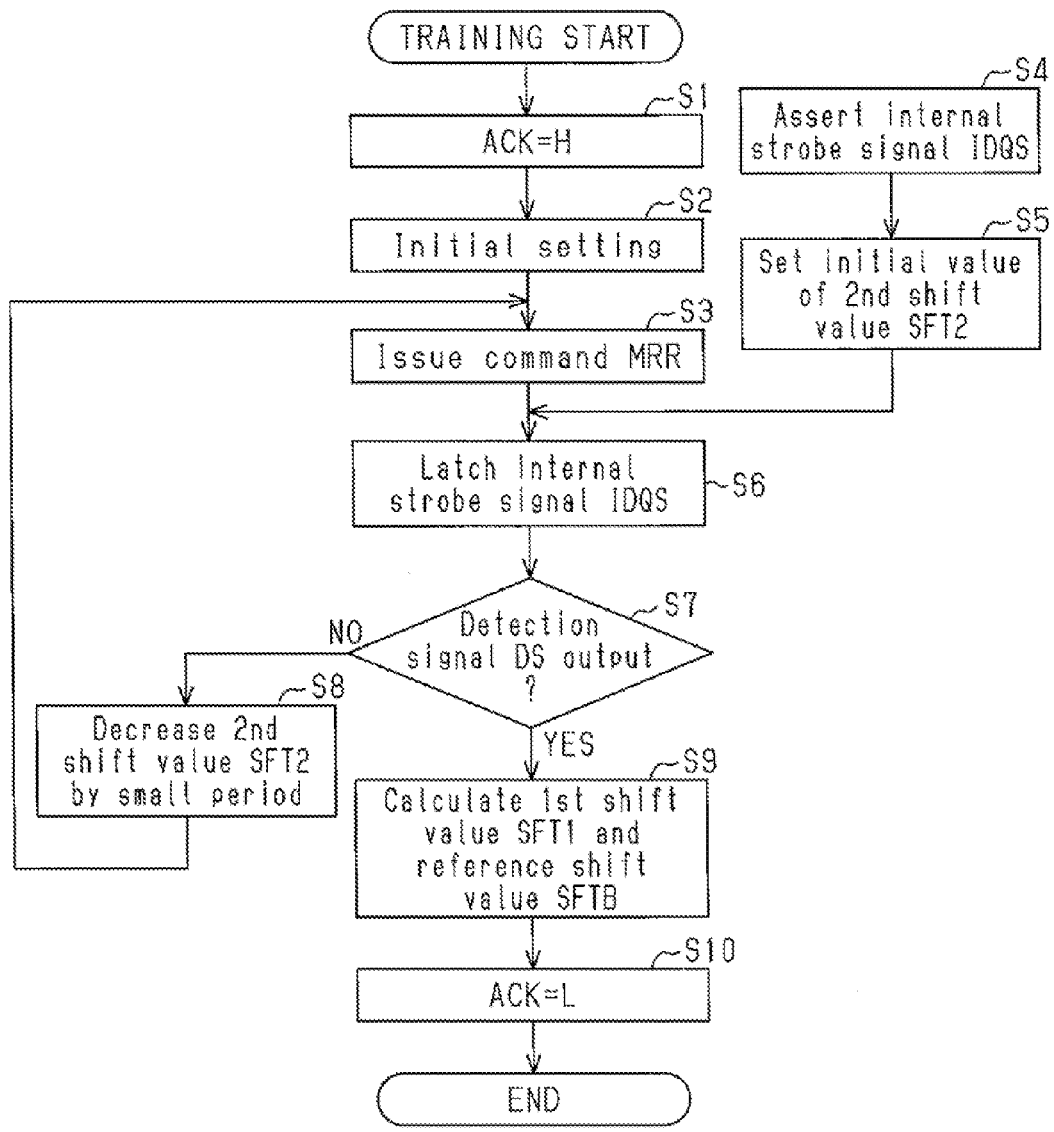
FIG. 8 is a flow chart illustrating the operation of the gate training at activation.

When the controller 10 is activated and the training control circuit 40 receives the request signal REQ from the memory controller 12, the training control circuit 40 rises the acknowledge signal ACK to the H-potential (Step S1 in FIG. 8). In subsequent initialization (Step S2), the search range is set based on the setting signal SS output from the training control circuit 40. Each of the bits b0 to b255 of the shift register 53A is set to an initial value (=1). At this time, the training control circuit 40 generates the mode switching signal MC that instructs the operation of the gate training at activation.

Subsequently, in response to the mode switching signal MC from the training control circuit 40, the control circuit 52 of the gate training control circuit 41 issues the mode resistor read command MRR (Step S3). In response to the mode resistor read command MRR, as in the manner in which the read command READ is input, the memory 20 controls the activation timing of the strobe signal DQS based on the rising edge of the clock signal CK (reference edge RE) after the read latency RL.

In the training circuit 15, the internal strobe signal IDQS is asserted (Step S4), and an initial value of the second shift value SFT2 is set (Step S5). This initial value of the second shift value SFT2 is set by the shift value setting circuit 51 in accordance with the search range designated in Step S2.

Figure 9:
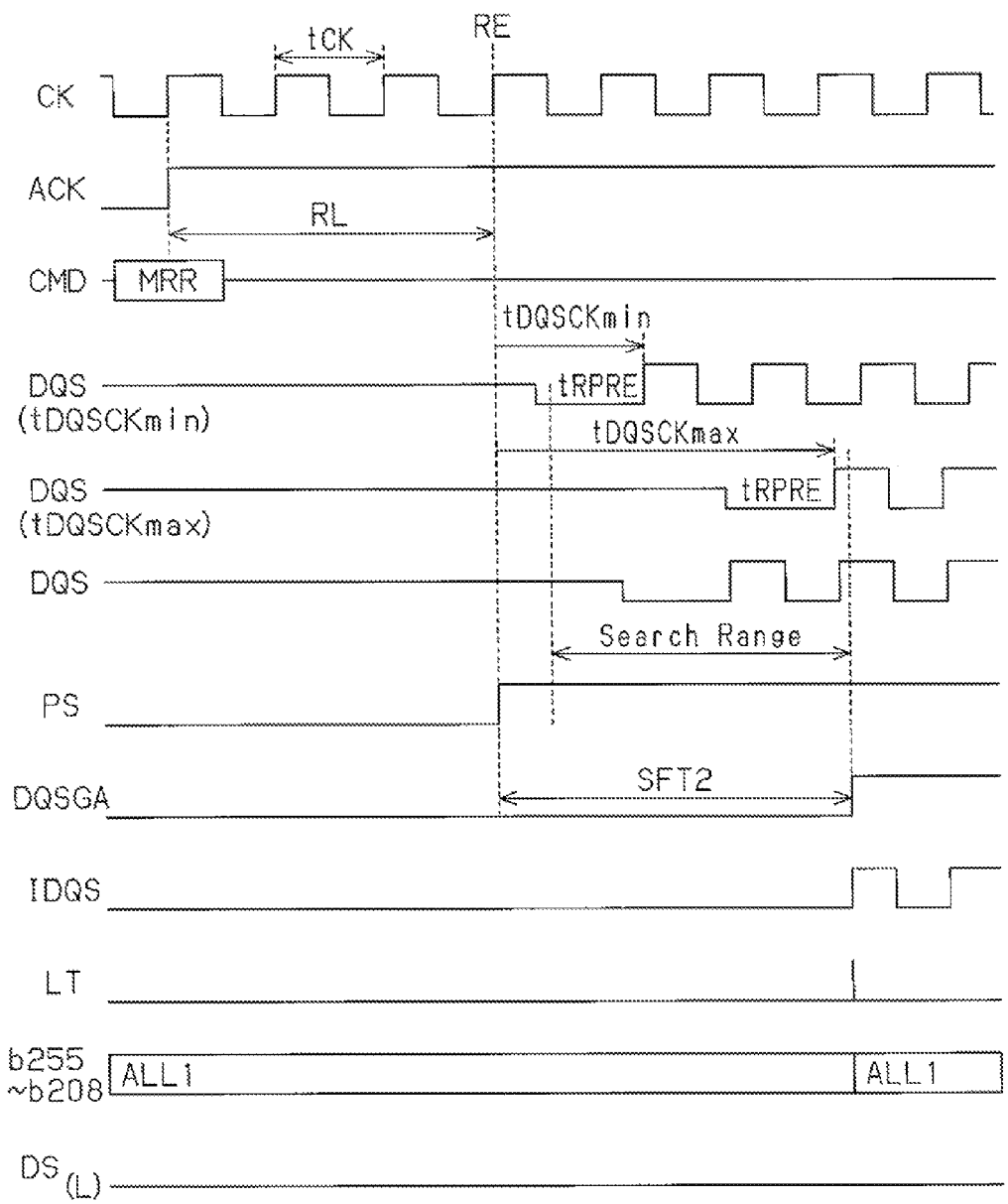
FIG. 9 is a timing chart illustrating the operation of the gate training at activation.

As illustrated in FIG. 9, the start position of the search range is designated to be temporally located rearward from the leading rising edge of the strobe signal DQS with the maximum delay time tDQSCKmax. However, the start position of the search range may be located at the same position (timing) as the leading rising edge of the strobe signal DQS with the maximum delay time tDQSCKmax. The end position of the search range is temporally located rearward from the start position of the preamble period tRPRE of the strobe signal DQS with the minimum delay time tDQSCKmin. The initial value of the second shift value SFT2 is set to a value corresponding a period from the reference edge RE of the clock signal CK to the start position of the search range.

The initial value of the second shift value SFT2 is provided to the delay control circuit 33 through the control circuit 52 and the third transmitting/receiving circuit 44. The delay control circuit 33 decodes the second shift value SFT2 to generate the second delay amount D2, and provides the second delay amount D2 to the first DLL circuit 34 of the receiving circuit 32. Then, the first DLL circuit 34 generates the internal strobe gate adjustment signal DQSGA by delaying the pulse signal PS that rises at the reference edge RE of the clock signal CK by a time corresponding to the second delay amount D2 (second shift value SFT2). Thereby, the internal strobe gate adjustment signal DQSGA that rises to the H-potential at the start position of the search range is generated. Then, when the internal strobe gate adjustment signal DQSGA is activated, that is, rises to the H-potential, the strobe signal DQS provided from the memory 20 is transmitted to the training circuit 15 through the delay control circuit 33 as the internal strobe signal IDQS.

Next, in response to the rising edge of the latch signal LT in synchronization with the rising edge of the internal strobe gate adjustment signal DQSGA, the capture circuit 53 of the training circuit 15 latches the potential of the internal strobe signal IDQS (Step S6 in FIG. 8). At this time, since the potential of the internal strobe signal IDQS is the H-potential in this embodiment, the H-potential is latched to the bit b255 of the shift register 53A. Thus, the 48 upper bits b255 to b208 are all "1". Accordingly, the detection signal DS remains to be L-potential, and the detection signal DS of H-potential is not output (NO in Step S7).

Then, the gate training operation is continued, and the second shift value SFT2 is decreased by the small period (Step S8). Thereby, the rising edge of the internal strobe gate adjustment signal DQSGA is temporally shifted forward from the start position of the search range.

Subsequently, when the processing returns to Step S3, and the mode resistor read command MRR is reissued, the strobe signal DQS is provided at the above-mentioned timing from the memory 20 to the memory interface circuit 13. Then, when the internal strobe gate adjustment signal DQSGA is activated at the activation timing changed in Step S8, the strobe signal DQS provided from the memory 20 is transferred to the capture circuit 53 as the internal strobe signal IDQS. Subsequently, in response to the rising edge of the latch signal LT in synchronization with the rising edge of the internal strobe gate adjustment signal DQSGA, the capture circuit 53 latches the potential of the internal strobe signal IDQS (Step S7).

By repeating a series of such operations, the rising edge of the internal strobe gate adjustment signal DQSGA is gradually time-shifted forward from the start position of the search range. As a result, based on the rising edge of the internal strobe gate adjustment signal DQSGA at the position (timing) time-shifted forward from the start position in sequence, the potential of the strobe signal DQS is sequentially captured.

Figure 10:
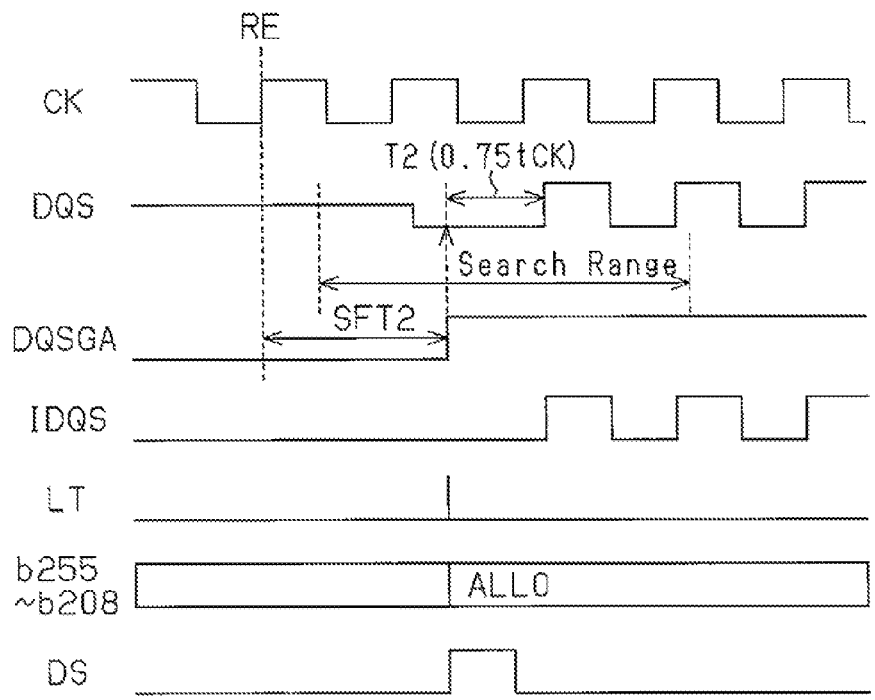
FIG. 10 is a timing chart illustrating the operation of the gate training at activation.

Then, as illustrated in FIG. 10, when the L-potential of the internal strobe signal IDQS is continuously captured for the second period T2 (0.75 tCK) prior to shift from the L-potential to the H-potential (leading rising edge) of the internal strobe signal IDQS (that is, the strobe signal DQS), all of the 48 upper bits b255 to b208 of the shift register 53A indicate "0". Then, in response to the output signal of H-potential from the NOR circuit 54A, the detection circuit 54 outputs the detection signal DS of H-potential (YES in Step S7 in FIG. 8). The detection signal DS of H-potential means that the activation timing of the internal strobe gate adjustment signal DQSGA at this time exists in the preamble period tRPRE of the strobe signal DQS.

Figure 11:
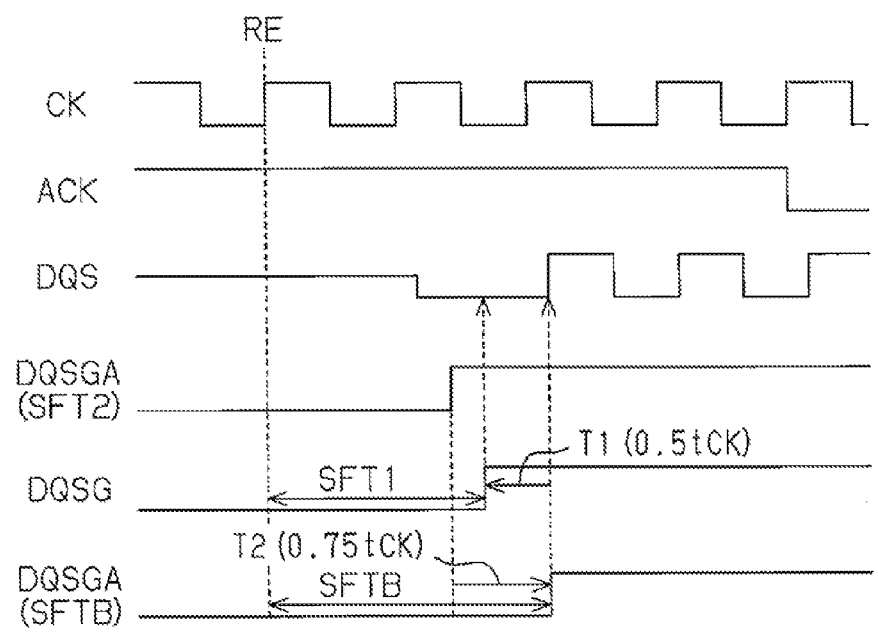
FIG. 11 is a timing chart illustrating the operation of the gate training at activation.

Subsequently, in response to the detection signal DS of H-potential and the mode switching signal MC, the shift value calculation circuit 55 calculates the first shift value SFT1 and the reference shift value SFTB (Step S9). As illustrated in FIG. 11, the shift value calculation circuit 55 calculates the reference shift value SFTB by adding the second period T2 (0.75 tCK) to the second shift value SFT2 used when the detection signal DS of H-potential is output so that the rising edge of the internal strobe gate adjustment signal DQSGA matches the leading rising edge of the strobe signal DQS. The shift value calculation circuit 55 also calculates the first shift value SFT1 by subtracting the first period T1 (0.5 tCK) from the reference shift value SFTB so that the rising edge of the internal strobe gate signal DQSG comes near the center of the preamble period tRPRE of the strobe signal DQS. In the read operation, the first shift value SFT1 is provided to the interface circuit 14, and the internal strobe gate signal DQSG is generated based on the first shift value SFT1. Thus, the receiving circuit 32 appropriately captures the strobe signal DQS as the internal strobe signal IDQS.

After the first shift value SFT1 and the reference shift value SFTB are calculated as described above, the training control circuit 40 falls the acknowledge signal ACK to the L-potential (Step S10), and terminates the gate training operation.

Next, the gate training during the operation of the controller 10 will now be described with reference to FIGS. 12 to 15. For simplification of description, in FIGS. 13 to 15, a vertical axis and a horizontal axis are appropriately extended or contracted.

Figure 13:
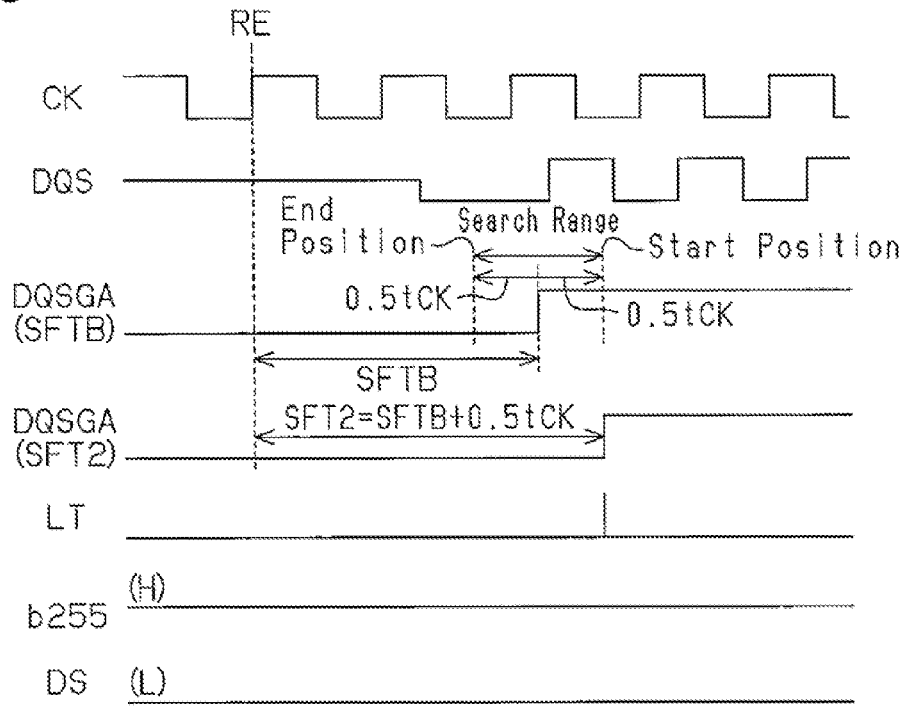
FIG. 13 is a timing chart illustrating the operation of the gate training during operation.

During the operation of the controller 10, when the core circuit 11 does not access the memory 20, and a time according to the specifications of the memory 20 (for example, 1.6 μs) elapses from the previous gate training, the request signal REQ is provided from the memory controller 12 to the training control circuit 40. Then, the training control circuit 40 rises the acknowledge signal ACK to the H-potential (Step S21). In subsequent initialization (Step S22), each of the bits b0 to b255 of the shift register 53A is set to the initial value (=1), and the search range is set according to the specifications of the memory 20. For example, the search range is set according to a change (change range) of the strobe signal DQS during the operation of the controller 10, which is allowed in the specifications of the memory 20. In this embodiment, as illustrated in FIG. 13, the search range is set to a range from the position (start position), which is obtained by adding 0.5 tCK to the reference shift value SFTB, to the position (end position), which is obtained by subtracting 0.5 tCK from the reference shift value SFTB. The training control circuit 40 generates the mode switching signal MC that designates the gate training during the operation of the controller 10.

Figure 12:
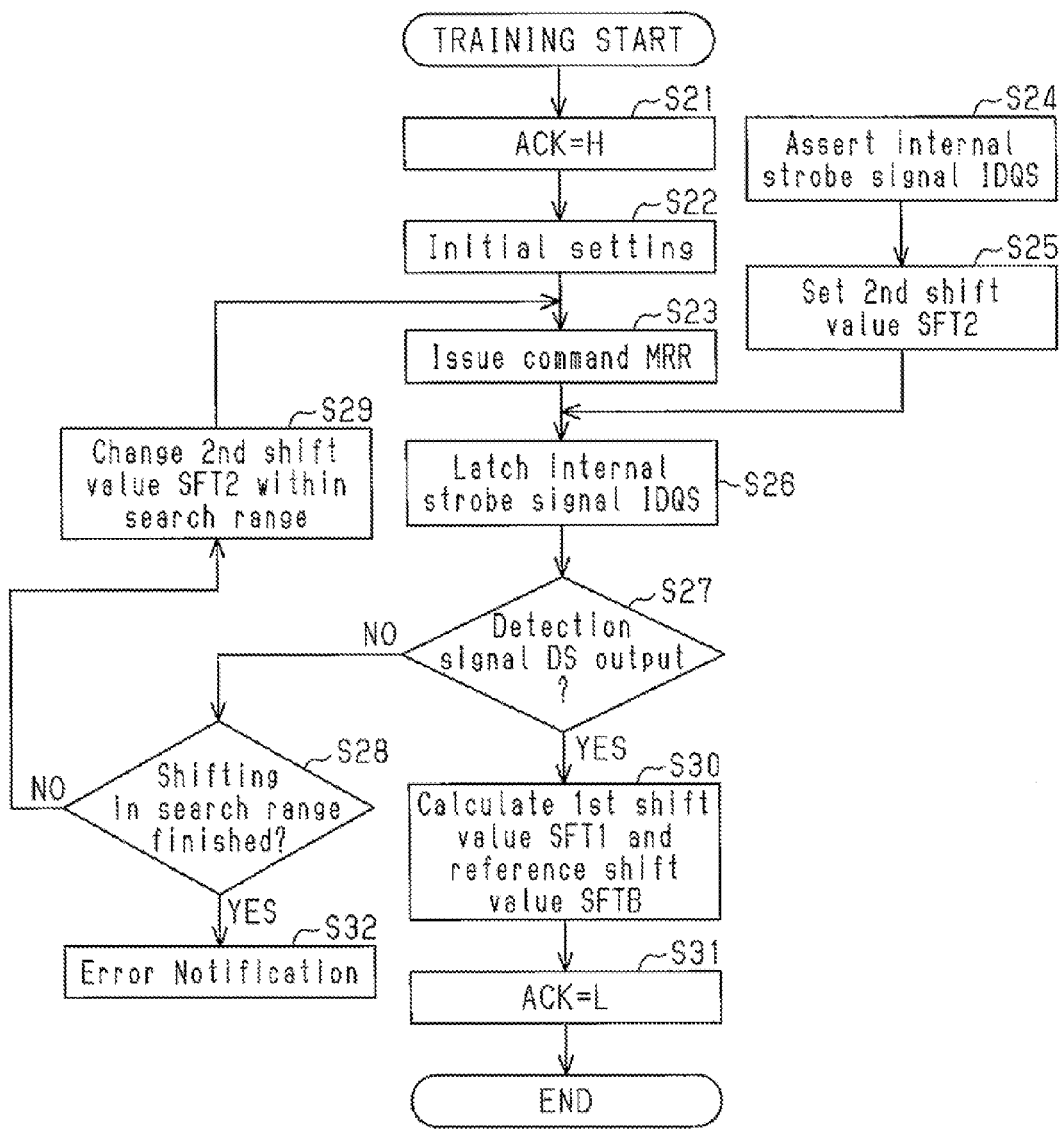
FIG. 12 is a flow chart illustrating the operation of the gate training during operation.

Next, the control circuit 52 of the gate training control circuit 41 issues the mode resistor read command MRR in response to the mode switching signal MC from the training control circuit 40 (Step S23 in FIG. 12). In response to the mode resistor read command MRR, the memory 20 provides the strobe signal DQS to the memory interface circuit 13 at the activation timing as in the manner in which the read command READ is input.

In the training circuit 15, the internal strobe signal IDQS is asserted (Step S24), and the second shift value SFT2 is set (Step S25). The second shift value SFT2 is set by the shift value setting circuit 51 in accordance with the start position of the search range designated in Step S22. In this embodiment, as illustrated in FIG. 13, the second shift value SFT2 is set to the period from the reference edge RE of the clock signal CK to the start position of the search range, that is, a value obtained by adding 0.5 tCK to the reference shift value SFTB.

The second shift value SFT2 thus set is provided to the delay control circuit 33 through the control circuit 52 and the third transmitting/receiving circuit 44. The delay control circuit 33 decodes the second shift value SFT2 to generate the second delay amount D2, and provides the second delay amount D2 to the first DLL circuit 34. Thereby, the internal strobe gate adjustment signal DQSGA that rises to the H-potential at the start position in the search range is generated. Then, when the internal strobe gate adjustment signal DQSGA is activated, that is, rises to the H-potential, the strobe signal DQS provided from the memory 20 is transmitted to the training circuit 15 through the delay control circuit 33 as the internal strobe signal IDQS.

Next, in response to the rising edge of the latch signal LT in synchronization with the rising edge of the internal strobe gate adjustment signal DQSGA, the capture circuit 53 of the training circuit 15 latches the potential of the internal strobe signal IDQS (Step S26 in FIG. 12). At this time, since in this embodiment, the potential of the internal strobe signal IDQS is the H-potential, the H-potential is latched to the bit b255 of the shift register 53A. That is, the potential of the bit b255 does not change from the initial value (=1) and thus, the potential latched to the bit b255 is the same as the potential latched to the bit b254. Therefore, the detection signal DS of H-potential is not output (NO in Step S27).

Next, since the shift operation of the internal strobe gate adjustment signal DQSGA in the search range is not finished (NO in Step S28), the second shift value SFT2 is decreased in the search range by the small period (Step S29). Thereby, the rising edge of the internal strobe gate adjustment signal DQSGA is time-shifted forward from the start position of the search range.

Figure 14:
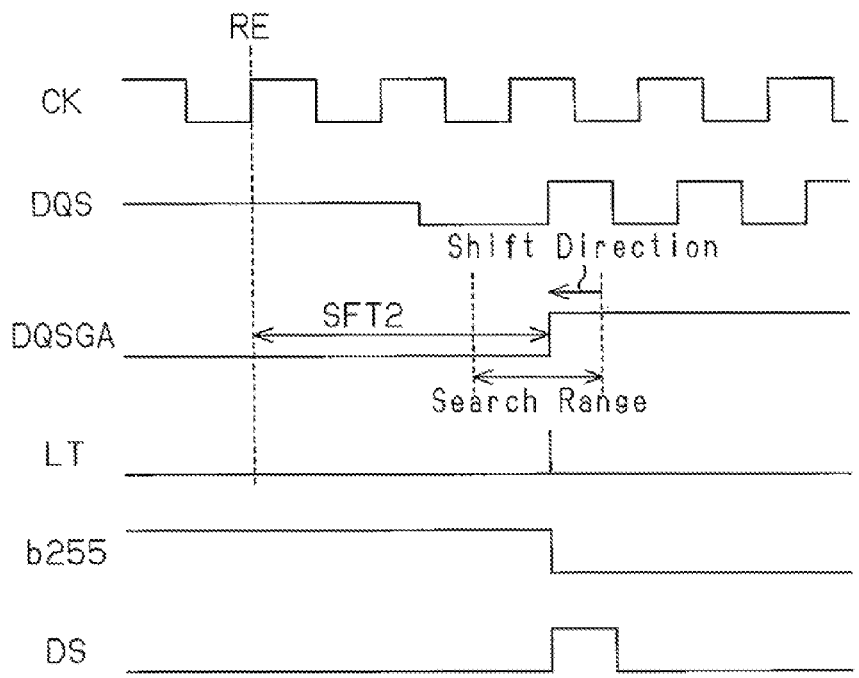
FIG. 14 is a timing chart illustrating the operation of the gate training during operation.

After that, the processing in Step S23 and Step S26 to S29 is repeatedly performed. Then, as illustrated in FIG. 14, when the internal strobe signal IDQS of L-potential is latched to the bit b255, the value latched to the bit b255 changes from "1" to "0". That is, the value latched to the bit b254 is different from the value latched to the bit b255. As a result, the change timing (leading rising edge) of the internal strobe signal IDQS (strobe signal DQS) from the L-potential to the H-potential is detected, and in response to the detection, the detection signal DS of H-potential is output (YES in Step S27). In this manner, in the search range, the bits b254 and b255 latch the different potential at the timing at which the leading rising edge of the strobe signal DQS occurs after the preamble period tRPRE.

Figure 15:
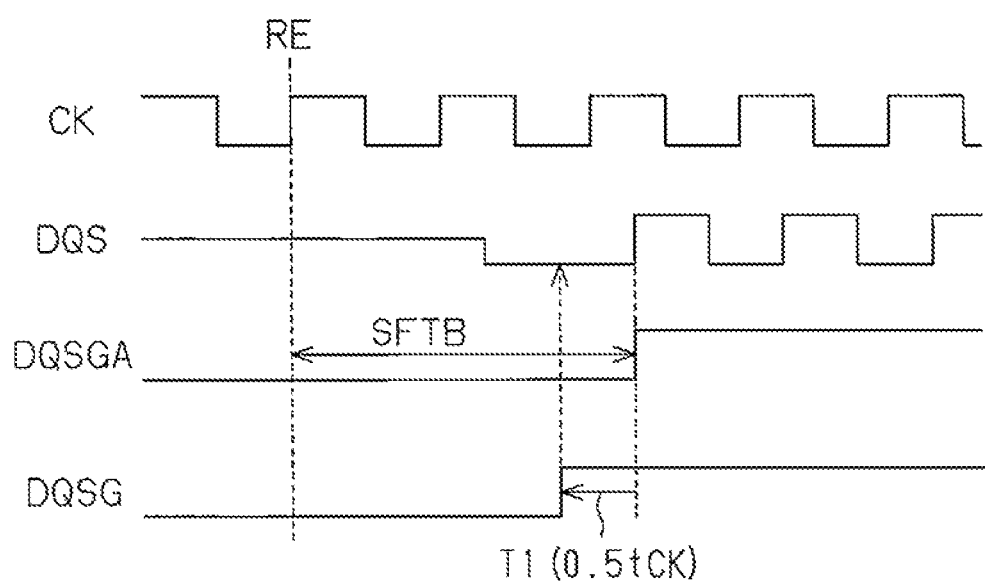
FIG. 15 is a timing chart illustrating the operation of the gate training during operation.
Figure 16A:
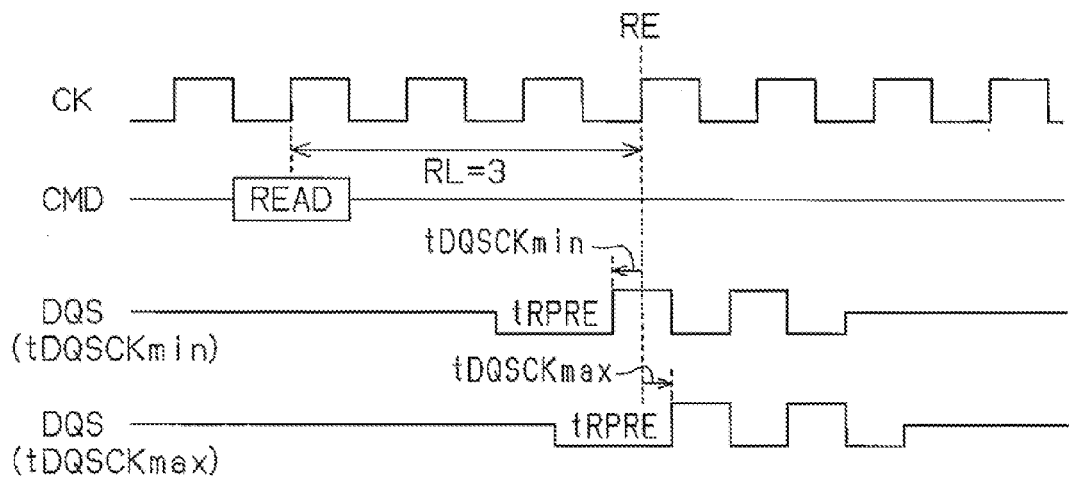
FIGS. 16A and 16B are timing charts illustrating operation of a gate training according to related art.
Figure 16B:
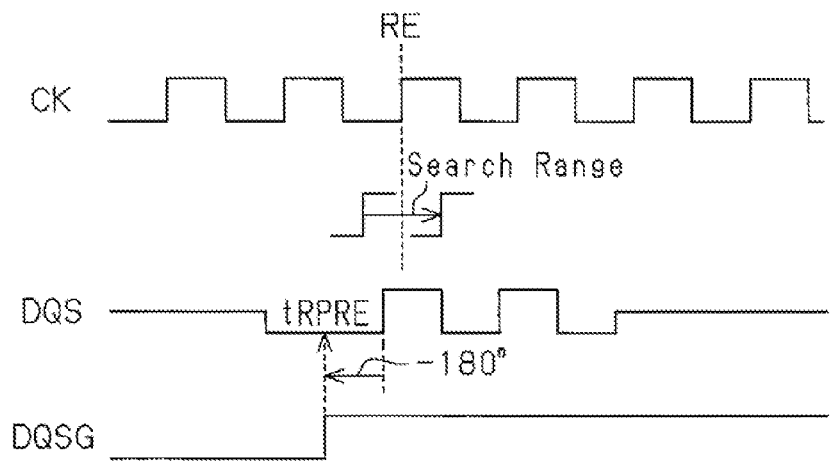

Subsequently, in response to the detection signal DS of H-potential and the mode switching signal MC, the shift value calculation circuit 55 calculates the first shift value SFT1 and the reference shift value SFTB (Step S30). As illustrated in FIG. 15, the shift value calculation circuit 55 generates the reference shift value SFTB based on the second shift value SFT2, which is used when the detection signal DS of H-potential is output, so that the activation timing of the internal strobe gate adjustment signal DQSGA substantially matches the leading rising edge of the strobe signal DQS. The shift value calculation circuit 55 also subtracts 0.5 tCK from the reference shift value SFTB to calculate the first shift value SFT1. Thereby, the activation timing of the internal strobe gate signal DQSG, which is delayed by the first shift value SFT1, comes near the center of the preamble period tRPRE of the strobe signal DQS. In the read operation, this internal strobe gate signal DQSG is provided to the AND circuit 35. Thus, the receiving circuit 32 may appropriately capture the strobe signal DQS as the internal strobe signal IDQS.

After the first shift value SFT1 and the reference shift value SFTB are calculated as described above, the training control circuit 40 falls the acknowledge signal ACK to the L-potential (Step S31 in FIG. 12), and terminates the gate training operation.

On the contrary, in the case where the detection signal DS of H-potential is not output, and the shift operation of the internal strobe gate adjustment signal DQSGA in the search range is finished (YES in Step S28), it is determined that the leading rising edge of the strobe signal DQS does not exist in the search range. In this case, the error signal ERR is output from the detection circuit 54 (Step S32). In response to the error signal ERR, the training control circuit 40 outputs the error flag EF to the memory controller 12, and requests the memory controller 12 to retry the gate training. Then, the memory controller 12 provides the training circuit 15 with the request signal REQ for performing the gate training at activation. At this time, the memory controller 12 does not output the acknowledge signal of the read request to the core circuit 11 in a period from the retry of the gate training at activation to the completion of the read operation.

In this manner, in the memory interface circuit 13 in this embodiment, when the change in the timing of the strobe signal DQS exceeds the search range, retry of the gate training is requested, and the gate training at activation is performed.

This embodiment has following advantages.

(1) The memory interface circuit 13 temporally shifts (i.e., time-shifts) the activation timing of the internal strobe gate adjustment signal DQSGA from the timing of the leading rising edge of the strobe signal DQS with the maximum delay time tDQSCKmax toward the front. Further, the memory interface circuit 13 sequentially captures the potential of the strobe signal DQS each time the internal strobe gate adjustment signal DQSGA is temporally shifted. When the L-potential of the strobe signal DQS continues for the second period T2, the memory interface circuit 13 generates the detection signal DS indicating that the preamble period tRPRE of the strobe signal DQS is detected. Thereby, the detection signal DS of H-potential is output before capturing the Hi-Z state that exists prior to the preamble period tRPRE. This prevents the strobe signal DQS in the Hi-Z state from being captured by the interface circuit 14.

Here, the timing position at which the detection signal DS of H-potential is output is the position time-shifted from the leading rising edge of the strobe signal DQS forward by the second period T2. Thus, based on the timing position, the activation timing of the internal strobe gate signal DQSG may be easily adjusted such that it comes near the center of the preamble period tRPRE of the strobe signal DQS.

(2) The memory interface circuit 13 relatively delays the internal strobe gate signal DQSG by the first period T1 (0.5 tCK) to generate the internal strobe gate adjustment signal DQSGA. The memory interface circuit 13 adjusts the activation timing of the internal strobe gate adjustment signal DQSGA so as to match the leading rising edge of the strobe signal DQS at completion of the gate training. Thereby, the activation timing of the internal strobe gate signal DQSG is controlled so as to come near the center of the preamble period tRPRE of the strobe signal DQS.

(3) In the gate training during the operation of the controller 10, the memory interface circuit 13 sets the search range based on the activation timing of the internal strobe gate adjustment signal DQSGA, which is adjusted in the previous gate training operation, and the range (±0.5 tCK) according to the specifications of the memory 20. In consideration of the specifications of the memory 20, a change in the timing of the strobe signal DQS during the operation of the controller 10 falls within one cycle time of the clock signal CK. Therefore, the gate training during the operation of the controller 10 may be performed in about one cycle time of the clock signal CK. In this manner, by using the activation timing of the gate adjustment signal DQSGA, which is adjusted to match the rising edge of the strobe signal DQS in the previous gate training operation, as a reference, the gate training during the operation of the controller 10 may be performed within a short time.

(4) In the gate training during the operation of the controller 10, when the leading rising edge of the strobe signal DQS is not detected in the search range, the memory interface circuit 13 informs the error to the memory controller 12. Accordingly, it is possible to request the memory controller 12 to retry the operation of the gate training at activation.

It should be apparent to those skilled in the art that the aforementioned embodiments may be embodied in many other forms without departing from the scope of the invention. Particularly, it should be understood that the aforementioned embodiments may be embodied in the following forms.

In the above-mentioned embodiment, the internal strobe gate signal DQSG is relatively delayed by the first period T1 (0.5 tCK) to generate the internal strobe gate adjustment signal DQSGA. However, a delay amount (first period T1) of the gate adjustment signal DQSGA from the internal strobe gate signal DQSG is not limited. For example, the first period T1 may be set to be smaller than the preamble period tRPRE of the strobe signal DQS. In this case, when the activation timing of the internal strobe gate adjustment signal DQSGA matches the leading rising edge of the strobe signal DQS, the activation timing of the internal strobe gate signal DQSG may be set in the preamble period tRPRE.

In the above-mentioned embodiment, the second period T2 is set to 0.75 tCK, and when the L-potential of the strobe signal DQS continues for 0.75 tCK, the preamble period tRPRE of the strobe signal DQS is detected. However, the second period T2 is not limited to 0.75 tCK. That is, as long as it may be detected that the L-potential of the strobe signal DQS continues for a period that is longer than the L-potential period of the strobe signal DQS (here, 0.5 tCK), the preamble period tRPRE may be detected. Thus, the second period T2 may be set to a period that is not more than the preamble period tRPRE (about 0.9 tCK) and is at least more than 0.5 tCK.

In the gate training in the above-mentioned embodiment, the strobe signal DQS is output to the training circuit 15 as the internal strobe signal IDQS at the activation timing of the internal strobe gate adjustment signal DQSGA. Alternatively, the strobe signal DQS may be output to the training circuit 15 as the internal strobe signal IDQS at both of the activation timing of the internal strobe gate signal DQSG and the activation timing of the internal strobe gate adjustment signal DQSGA. According to this structure, by the combination of the potential of the internal strobe signal IDQS, which is captured at the activation timing of the internal strobe gate signal DQSG, and the potential of the internal strobe signal IDQS, which is captured at the activation timing of the internal strobe gate adjustment signal DQSGA, the preamble period tRPRE may be detected more reliably. In this case, the preamble period tRPRE may be detected based on the potential of the internal strobe signal IDQS, which is captured at the activation timing of the internal strobe gate signal DQSG, and terminate the gate training operation based on the detection.

In the above-mentioned embodiment, in the gate training during the operation of the controller 10, the start position of the search range is set to the position obtained by adding 0.5 tCK to the reference shift value SFTB. Alternatively, for example, the start position of the search range may be set to a position obtained by subtracting 0.5 tCK from the reference shift value SFTB. In this case, the activation timing of the internal strobe gate adjustment signal DQSGA is gradually time-shifted rearward from the start position.

In the above-mentioned embodiment, the internal structure of the receiving circuit 32 is not limited to the circuit illustrated in FIG. 5. For example, in the receiving circuit 32 in FIG. 5, both of the internal strobe gate signal DQSG and the internal strobe gate adjustment signal DQSGA are generated in the first DLL circuit 34, but the internal strobe gate signal DQSG and the internal strobe gate adjustment signal DQSGA may be separately generated in different circuits.

In the above-mentioned embodiment, the memory interface circuit 13 is applied to the memory 20 that serves as the LPDDR2-SDRAM, but may be applied to the other memory having no DLL circuit. The memory interface circuit may be applied to a memory capable of operating in a DLL off-mode of deactivating the DLL circuit (for example, the DDR3-SDRAM).

All examples and conditional language recited herein are intended for pedagogical purposes to aid the reader in understanding the principles of the invention and the concepts contributed by the inventor to furthering the art, and are to be construed as being without limitation to such recited examples and conditions, nor does the organization of such examples in the specification relate to an illustration of the superiority and inferiority of the invention. Although the embodiment(s) of the present invention(s) has (have) been described in detail, it should be understood that the various changes, substitutions, and alterations could be made hereto without departing from the spirit and scope of the invention.

The invention claimed is:

1. A memory interface circuit that controls capture timing of data provided from a memory in accordance with a strobe signal provided from the memory, the memory interface circuit comprising:

a control unit configured to control an activation timing of an internal strobe gate signal, which masks the strobe signal when the internal strobe gate signal is being deactivated, by relatively delaying the internal strobe gate signal by a first period that is shorter than one cycle time of a clock signal to generate an internal strobe gate adjustment signal, and by adjusting an activation timing of the internal strobe gate adjustment signal; and a detection unit configured to output a detection signal, wherein the detection unit captures the strobe signal based on the activation timing of the internal strobe gate adjustment signal adjusted by the control unit and outputs the detection signal, when the strobe signal changes from a first potential to a second potential which is higher than the first potential, or when the first potential of the strobe signal continues for a second period or longer;

the control unit adjusts the activation timing of the internal strobe gate adjustment signal in accordance with the detection signal.

2. The memory interface circuit according to claim 1, wherein:

the control unit changes the activation timing of the internal strobe gate adjustment signal by decreasing a delay set value, which defines the activation timing of the internal strobe gate adjustment signal, in a stepwise manner;

the detection unit captures the potential of the strobe signal based on the activation timing of the internal strobe gate adjustment signal that has been changed, and outputs the detection signal at the timing at which the first potential of the strobe signal continues for the second period or longer, wherein the second period exceeds at least a ½ cycle time of the clock signal; and the control unit delays the activation timing of the internal strobe gate adjustment signal by the second period in accordance with the detection signal.

3. The memory interface circuit according to claim 1, wherein:

the control unit changes the activation timing of the internal strobe gate adjustment signal by changing a delay set value, which defines the activation timing of the internal strobe gate adjustment signal, in a stepwise manner in a range according to output delay specifications of the memory;

the detection unit captures the potential of the strobe signal based on the activation timing of the internal strobe gate adjustment signal that has been changed, and outputs the detection signal at the timing of when the strobe signal changes from the first potential to the second potential; and the control unit adjusts the activation timing of the strobe gate adjustment signal in accordance with the detection signal so as to match the timing of when the strobe signal changes from the first potential to the second potential.

4. The memory interface circuit according to claim 3, wherein the range according to the output delay specifications of the memory is a range of ±½ cycle time of the clock signal with respect to the activation timing of the internal strobe gate adjustment signal which is set by the delay set value.

5. The memory interface circuit according to claim 3, wherein the detection unit generates an error signal when the detection unit does not detect the timing of when the strobe signal changes from the first potential to the second potential.

6. The memory interface circuit according to claim 1, wherein:
the internal strobe gate adjustment signal is generated by relatively delaying the internal strobe gate signal by a ½ cycle time of the clock signal;
the detection unit outputs the detection signal when detecting that the first potential of the strobe signal continues for a ¾ cycle time of the clock signal or longer; and
the control unit delays the activation timing of the internal strobe gate adjustment signal by a ¾ cycle time of the clock signal in accordance with detection signal.

7. The memory interface circuit according to claim 1, wherein
the control unit sets an initial value of the delay set value, which defines the activation timing of the internal strobe gate adjustment signal, so that the activation timing of the internal strobe gate adjustment signal comes later than a leading rising edge of the strobe signal following a preamble period of the strobe signal when a delay time of the strobe signal from the clock signal is maximum.

8. The memory interface circuit according to claim 1, wherein:
when the activation timing of the internal strobe gate signal is adjusted at activation of a system device, the detection unit detects the timing at which the first potential of the strobe signal continues for the second period or longer, and outputs the detection signal; and
when the activation timing of the internal strobe gate signal is adjusted during operation of the system device, the detection unit detects the timing at which the strobe signal changes from the first potential to the second potential, and outputs the detection signal.

9. The memory interface circuit according to claim 1, wherein
the control unit includes a delay circuit that generates the internal strobe gate signal, wherein the control unit changes a delay set value, which defines the activation timing of the internal strobe gate adjustment signal, in a stepwise manner in accordance with a time resolution of the delay circuit.

10. A method of adjusting capture timing of data provided from a memory in accordance with a strobe signal provided from the memory, the method comprising:
generating an internal strobe gate signal that masks the strobe signal when the internal strobe gate signal is being deactivated;
relatively delaying the internal strobe gate signal by a first period that is shorter than one cycle time of a clock signal to generate an internal strobe gate adjustment signal;
outputting a detection signal, when the strobe signal changes from a first potential to a second potential which is higher than the first potential, or when the first potential of the strobe signal continues for a second period or longer;
adjusting the activation timing of the internal strobe gate signal by adjusting an activation timing of the internal strobe gate adjustment signal in accordance with the detection signal; and
capturing the strobe signal based on the adjusted activation timing of the internal strobe gate adjustment signal.

* * * * *